United States Patent [19]

Pellon

[11] Patent Number: 5,608,400
[45] Date of Patent: Mar. 4, 1997

[54] SELECTABLE INTERMEDIATE FREQUENCY SIGMA-DELTA ANALOG-TO-DIGITAL CONVERTER

[75] Inventor: Leopold E. Pellon, Mt. Holly, N.J.

[73] Assignee: Martin Marietta Corporation, Moorestown, N.J.

[21] Appl. No.: 519,593

[22] Filed: Aug. 24, 1995

[51] Int. Cl.$^6$ .................................................. H03M 3/00
[52] U.S. Cl. ............................................................... 341/143
[58] Field of Search .................................. 341/143, 155; 364/178, 180, 724.1, 724.17

[56] References Cited

U.S. PATENT DOCUMENTS

| | | | |
|---|---|---|---|
| 5,103,228 | 4/1992 | Voorman et al. | 341/143 |
| 5,243,345 | 9/1993 | Naus et al. | 341/143 |
| 5,392,042 | 2/1995 | Pellon | 341/143 |

*Primary Examiner*—Brian K. Young
*Attorney, Agent, or Firm*—W. H. Meise; C. A. Nieves; S. A. Young

[57] ABSTRACT

A sigma-delta analog-to-digital converter (10) provides high loop gain for suppression of noise components by use of a regenerative feedback loop or resonator (50), which produces a comb resonance response 212), embedded in the main degenerative feedback loop (48). The main loop includes an ADC (32) which samples at a clock frequency, which in turn defines a Nyquist frequency. The main loop also includes a DAC (38) which has a transfer function (42), which is equalized by a filter (44). The resonator (50) includes a low-pass filter (52) which matches the equalized main loop transfer function, a DC block (56), and a null filter (54) which nulls the resonator gain at the comb peak which lies above the Nyquist frequency. The open-loop transfer function of the regenerative loop (50) is set to unity gain and $0°\pm N\,360°$ phase at the frequency of the analog input signal. A multipole embodiment (510) has multiple regenerative loops (55$o$) which produce multipole noise rejection (642). Resonators (751) are used in other $\Sigma\Delta$ ADCs (790, 890).

11 Claims, 15 Drawing Sheets

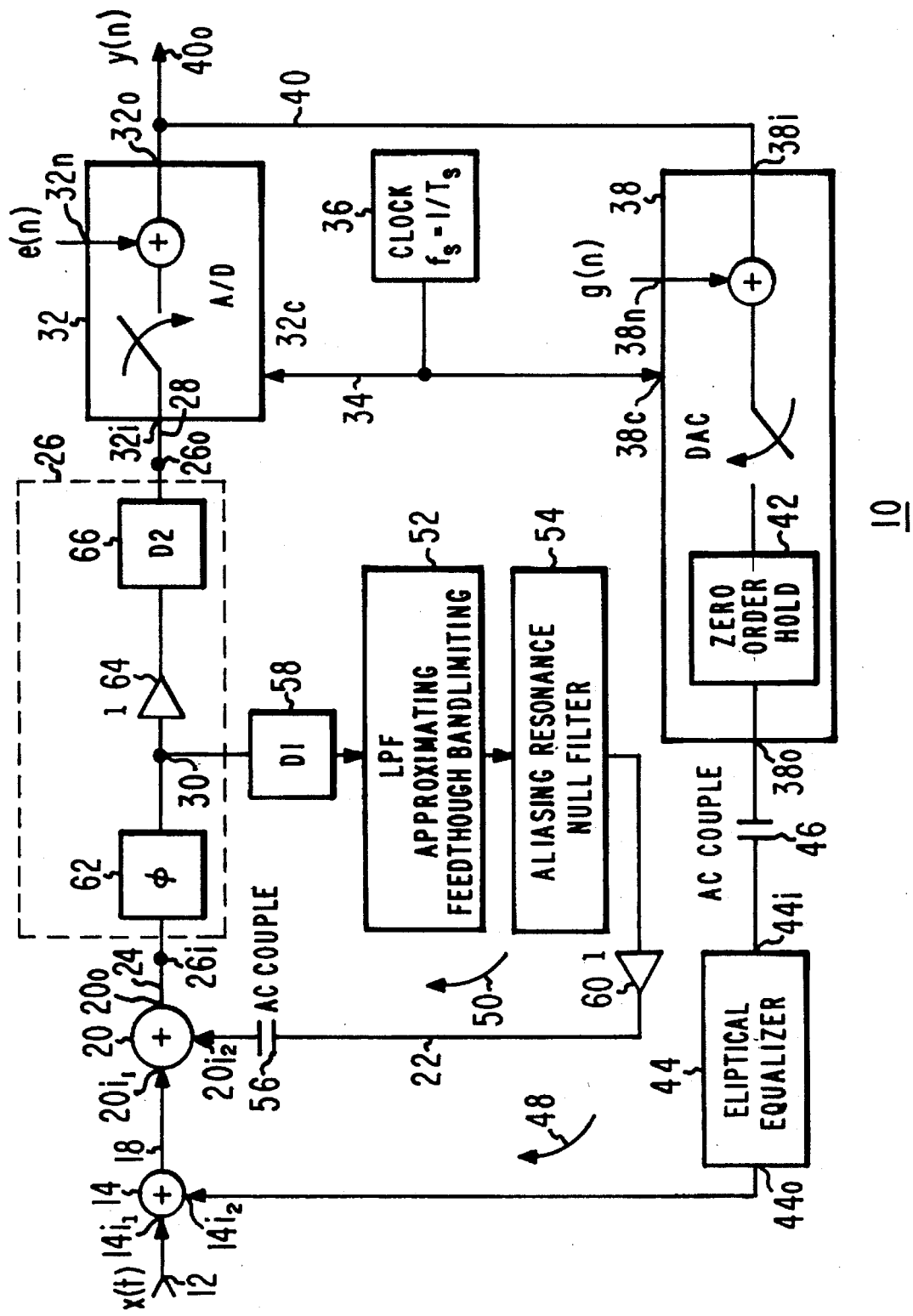

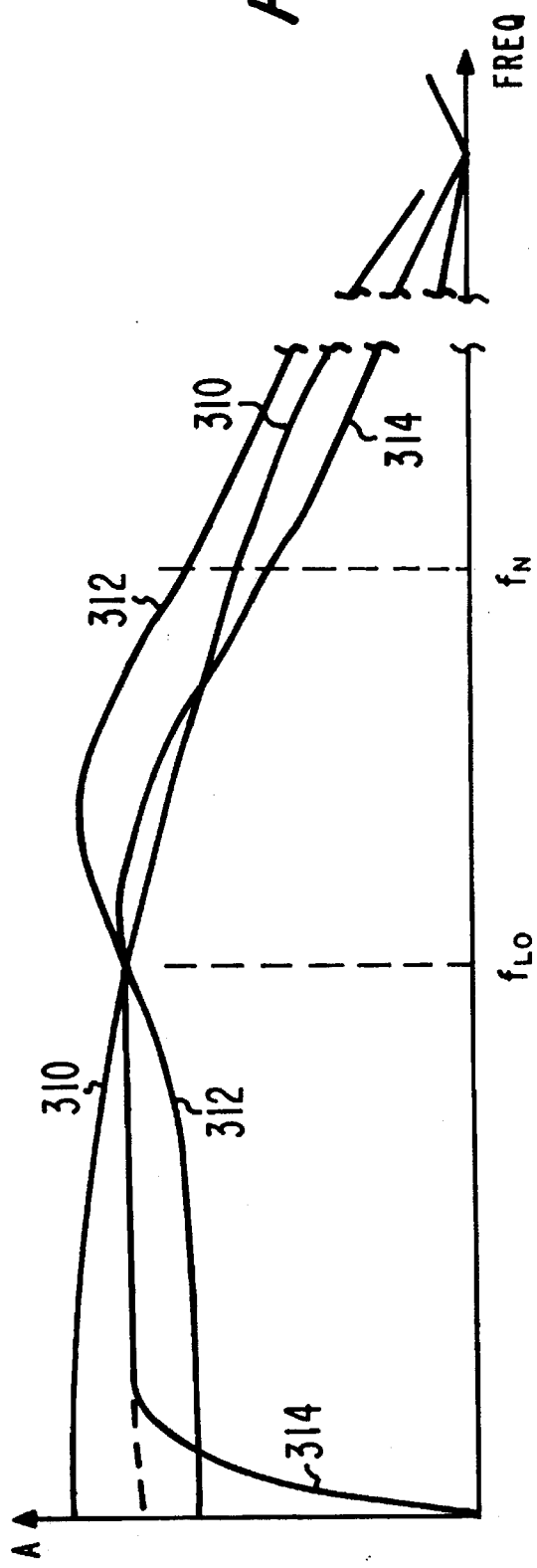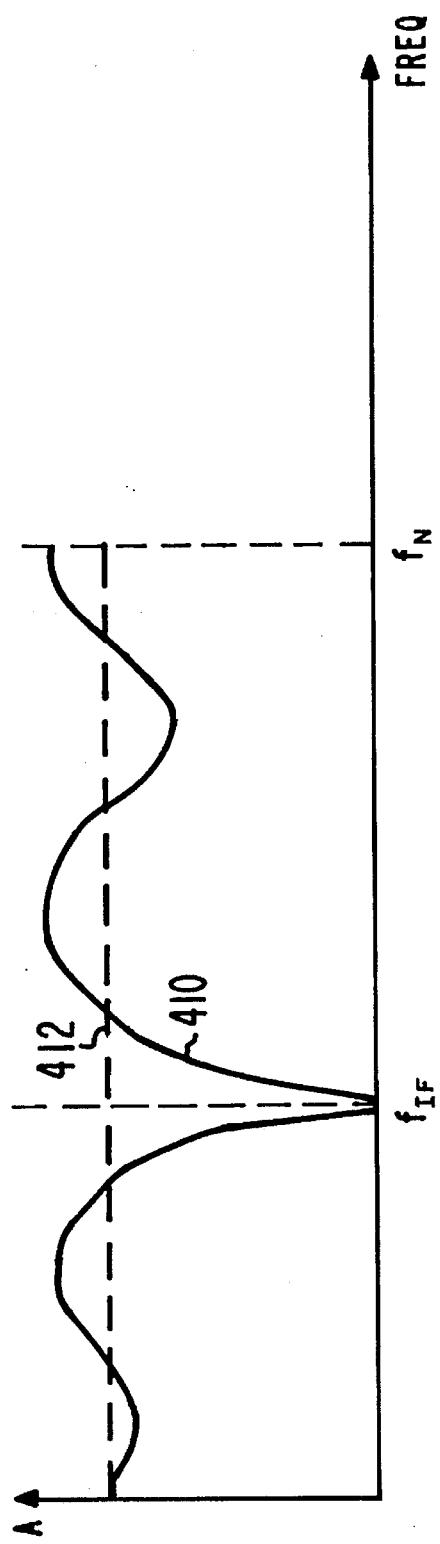

SELECTABLE INTERMEDIATE FREQUENCY SIGMA-DELTA ANALOG-TO-DIGITAL CONVERTER

FIELD OF THE INVENTION

This invention relates to sigma-delta analog-to-digital converters, and especially to such converters which utilize regenerative resonators to provide high loop gain at particular frequencies at which noise is to be suppressed.

BACKGROUND OF THE INVENTION

Sigma-Delta analog-to-digital converters are used for situations requiring high resolution and/or high bandwidth. The prior art is extensively described in U.S. Pat. No. 5,392,042, issued Feb. 21, 1995 in the name of Pellon.

Certain prior-art sigma-delta analog-to-digital converters, in implementations using continuous-time (not sampled in time)loop filters together with a sampling analog-to-digital converter and a corresponding sampling digital-to-analog converter, it is not possible to select the center frequency to the frequency at which the analog signal is centered, and at which noise is to be attenuated, independently of the sampling rate. In order for the prior-art converters to achieve a particular amount of noise reduction over a particular bandwidth, high-order filters were required, which in turn resulted in out-of-band "noise growth," in which the quantizing noise outside the band of interest is amplified. This noise causes a quantizer with limited range (number of bits) to truncate or clip noise peaks, resulting in instability of the sigma-delta loop. Also, in any continuous-time implementation, the tolerances of component values used in the loop filters, and the changes in value as a function of frequency, tends to reduce performance, or even to cause instability.

An improved sigma-delta analog-to-digital converter is desired.

SUMMARY OF THE INVENTION

A sigma-delta ($\Sigma\Delta$) analog-to-digital converter (ADC) includes a regenerative loop or resonator which provides high loop gain over a limited band of frequencies within the degenerative feedback loop. The band of frequencies encompasses the bandwidth of the analog signals which are to be converted into digital form. The analog-to-digital encoder includes an analog summing arrangement, a first input port of which is coupled to receive the analog input signals which are to be converted into digital form, and which also includes second and third input ports, and an output port at which sum signals are generated which represent the sum of the analog input signals with signals applied to the second and third input ports. An analog-to-digital converter arrangement including an input port, an output port, and a sampling clock input port, for converting analog signals applied to its input port into digital signals at its output port, at the frequency of the clock input. The analog-to-digital converter arrangement is subject to noise, and also subject to aliasing for frequencies of the analog signals applied to the input port of the analog-to-digital converter arrangement which lie above a Nyquist frequency equal to one-half of the frequency of the clock input. A digital-to-analog converter arrangement includes an input port coupled to the output port of the analog-to-digital converter arrangement, and also includes an output port and a sampling clock input port, for converting digital signals applied to its input port into analog signals at its output port, at the frequency of the clock input. The analog signals at the output port of the digital-to-analog converter arrangement are subject to unwanted amplitude variations below a cutoff frequency, which cutoff frequency lies between the Nyquist frequency and a selected resonance frequency from a comb of periodic resonance frequencies. A clock arrangement is coupled to the clock input port of the analog-to-digital converter arrangement and to the clock input port of the digital-to-analog converter arrangement, for clocking the digital-to-analog converter arrangement and the analog-to-digital converter arrangement at the clock frequency, whereby the analog-to-digital converter arrangement and the digital-to-analog converter arrangement both generate alias components. A coupling arrangement includes an input port coupled to the output port of the summing arrangement, an output port coupled to the input port of the analog-to-digital converter arrangement, and also includes a third port, for coupling signals from the summing arrangement to the analog-to-digital converter arrangement, and for coupling a sample of the signals traversing the coupling arrangement to the third port of the coupling arrangement. An amplitude equalizing arrangement including an input port and an output port is provided, having an equalizing response selected for tending to reduce the unwanted amplitude variations with frequency of the digital-to-analog converter arrangement, and for preferentially attenuating components at frequencies greater than the cutoff frequency. A DC blocking arrangement is coupled to the output port of the digital-to-analog converter arrangement, to the input and output ports of the amplitude equalization arrangement, and to the second input port of the summing arrangement, for coupling the output port of the digital-to-analog converter arrangement by a first path to the input port of the amplitude equalization arrangement, and for coupling the output port of the amplitude equalization arrangement by a second path to the second port of the summing arrangement. At least one of the first and second paths of the DC blocking arrangement provides only AC coupling, thereby closing a main degenerative feedback loop having a main loop gain and phase which generates, at the output port of the analog-to-digital converter arrangement, a digital representation of the analog input signal, which digital representation may contain unwanted noise. A time-delay arrangement and a DC blocking filtering arrangement including an input port and an output port are provided. The DC blocking filtering arrangement exhibits an open-loop transmission response substantially equal to that of the main loop gain and phase, except for a null at that one of the resonance frequencies of the comb which lies immediately above the Nyquist frequency. A regenerative loop coupling arrangement is coupled to the time-delay arrangement, to the third port of the coupling arrangement, to the input and output ports of the DC blocking filtering arrangement, and to the third input port of the summing arrangement, for thereby forming a regenerative feedback loop including the time-delay arrangement, the DC blocking filtering arrangement, the summing arrangement, and that portion of the coupling arrangement lying between the input and third ports of the coupling arrangement. The delay of the regenerative loop coupling arrangement, when combined with the delay of the time-delay arrangement, the DC blocking filtering arrangement, and that portion of the coupling arrangement lying between the input and third ports, is selected to have nominally unity gain and zero degrees of phase shift at the selected resonance frequency, whereby (a) the delay of the regenerative loop establishes the selected resonance frequency, (b) the open-loop gain of the main loop, with the regenerative loop in the main loop, is maximized at the selected resonance frequency, and (c) the noise of the analog-to-digital converter arrangement is attenuated at the selected resonance frequency when both the main and regenerative loops are closed.

In a particular embodiment of the invention, the encoder further includes a delay arrangement coupled in one of the main and regenerative feedback loops for tending to make the loop delay of the main loop equal to the loop delay of the regenerative loop. The regenerative loop includes at least one phase shifter, which controls the frequency of the fundamental one of said resonant frequencies of the comb, without changing the frequency between the teeth of the comb. Thus, the delay element establishes the comb interval, while the phase shifter, in conjunction with the delay element, establishes the frequency of the fundamental or lowest-frequency element of the comb. This allows the frequencies at which the loop gain of the analog-to-digital converter is maximized, and the frequencies at which noise is attenuated, to be independently set. In this multipole embodiment, phase shifters on each of the weighting paths produce a shifted multiple resonance over a specified band, such that each of the teeth of the comb has a multipole resonance characteristic.

DESCRIPTION OF THE DRAWING

FIG. 1 is a diagram, in simplified block and schematic form, of a sigma-delta analog-to-digital converter in accordance with an aspect of the invention, including a degenerative main feedback loop and a gain-enhancing regenerative feedback loop embedded in the main loop;

FIGS. 2a, 2b, 2c, 2d, and 2e are referred to jointly as FIG. 2;

FIG. 3 represents the idealized amplitude-frequency response of a portion of the main degenerative feedback loop of FIG. 1;

FIG. 4 is an idealized amplitude-frequency plot which illustrates the performance of the arrangement of FIG. 1 with both the regenerative loop and the main degenerative loop closed;

DESCRIPTION OF THE INVENTION

Figure 2A:
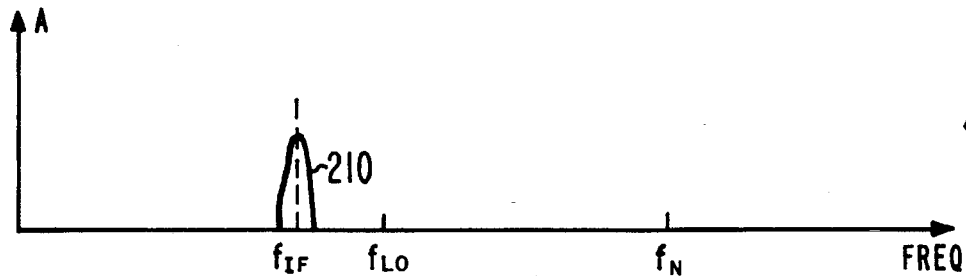
FIG. 2a is an idealized amplitude-frequency plot of a band-limited analog input signal.

FIG. 1 is a simplified block and schematic diagram of a sigma-delta ($\Sigma\Delta$) encoder 10 in accordance with an aspect of the invention. In FIG. 1, analog input signals x(t) which are to be converted to digital form are applied to an input port 12. The analog input signals are band-limited, as would be the case, for example, if they were modulated onto a radio-frequency (RF) or intermediate-frequency (IF) carrier. FIG. 2a illustrates an idealized amplitude (A) versus -frequency plot of a band-limited analog input signal spectrum 210 centered on an IF frequency. The analog input signals applied to input port 12 are coupled to a first input port $14_1$ of a summing circuit 14, where they are combined with a signal applied to a second input port $14i_2$ of summing circuit 14 by way of a signal path 16. The summed signals are coupled from summing circuit 14 by way of a path 18 to a first input port $20i_1$ of a further summing circuit 20. Summing circuit 20 sums the signals applied to its first input port $20i$ from signal path 18 with analog signals applied to its second input port $20i_2$ from a signal path 22, to produce a summed signal at its output port $20o$, which is coupled onto signal path 24. Summing circuits 14 and 20 together may be viewed as a three-input-port summing circuit, which produces a summed signal on signal path 24. The three input ports, taking this view, are $14i_1$, $14i_2$, and $20i_2$.

A coupling arrangement 26 of FIG. 1 receives signals applied from signal path 24 at its input port $26i$, and couples them to an output port $26o$ and a signal path 28. Coupling arrangement 26 also samples the signals traversing from its input port $26i$ to output port $26o$ to a tap or sample port 30, for reasons described below. The signals coupled from output port $26o$ of coupling arrangement 26 onto signal path 28 are applied to an input port $32_i$ of an analog-to-digital converter (ADC) 32, which is sampled at a clock rate by a clock signal applied to a clock input port 32c from a signal path 34. Analog-to-digital converter 32 samples digital signals applied to its input port 38i at the clock rate, and converts the signals into digital form. Those skilled in the art know that the noise of ADC 32 may be represented as a noise signal e(n) applied to a effective noise input port 32n, and that such an ADC should have low latency or time delay, and that it may be desirable to sacrifice resolution (number of bits) to achieve higher speed. The digital signal is generated as $y_n$ on output port 32o. The digital signal from port 32o is applied to a system output port 40o, and is also applied by an output signal path 40 to an input port 38i of DAC 38. A clock signal generator 36 generates clock signals at a clock frequency $f_S$, which are applied by way of signal path 34 to clock input port 32c of ADC 32 and to a clock input port 38c of a digital-to-analog converter (DAC) 38. Those skilled in the art know that the noise of the DAC 38 may be represented as a noise signal g(n) applied to a effective noise input port 38n.

Digital-to-analog converter 38 of FIG. 1 receives the digital signal applied over signal path 40 from output port 32o of ADC 32, and converts the digital signal into analog form at the clock rate. As is known to those skilled in the art, a zero-order hold spectral response, illustrated as a block 42, is generally inherent in DAC 38. DAC 38 produces its analog signal output at an output port 38o. An amplitude equalizer 44 is provided. Equalizer 44 has an amplitude response selected to flatten or compensate, up to a cutoff frequency $f_{CO}$, for the magnitude response of the zero-order hold 42 of DAC 38, as described in more detail below. Equalizer 44 is coupled to the second input port $14i_2$ of summing circuit 12 and to output port 38o of DAC 38 by a coupling circuit, which includes at least one direct-current (DC) blocking or AC-coupling path. As illustrated in FIG. 1, the coupling circuit includes a capacitor 46 coupled to output port 38o of DAC 38 and to input port 44i of equalizer 44, together with an all-pass conductive signal path 16 coupled between output port 44o of equalizer 44 and second input port $14i_2$ of summing circuit 12. The positions of capacitor 46 and all-pass conductor 16 could be interchanged, if desired. The described connections establish a main degenerative loop suggested by an arrow 48. In a preferred embodiment of the invention, the equalizer is an elliptical filter.

The sigma-delta analog-to-digital converter 10 of FIG. 1 also enhances the open-loop gain of main loop 48 at a frequency, which as described below is selected to include the IF frequency (or any other desired frequency) at which the analog input signal is centered. The open-loop gain of the main loop 48 is enhanced by a regenerative or positive-feedback loop (resonator), suggested by an arrow 50, embedded in the main loop. Regenerative feedback loop 50, as illustrated in FIG. 1, includes a low-pass filter (LPF) 52, an aliasing resonance null filter 54, and a DC blocking or AC-passing capacitor 56, coupled in cascade, by conductors designated generally as 22, between tap port 30 of coupling arrangement 26 and input port $20i_2$ of summing circuit 20. The cascade of LPF 52, null filter 54, and DC blocking capacitor 56, is interconnected by a delay line 58, conductors 22, and a loop gain element or amplifier 60. The regenerative loop 50 thus includes not only delay line 58, LPF 52, null filter 54, amplifier 60, and capacitor 56, but also includes a portion of summing circuit 20, together with that portion of coupling arrangement 26 which lies between input port 26i and tap port 30. The portion of coupling circuit 26 included within regenerative loop 50 contains a phase (φ) shifter 62. Coupling circuit 26 also includes a gain element 64 associated with main degenerative feedback loop 48 and a further delay element 66.

Figure 2B:
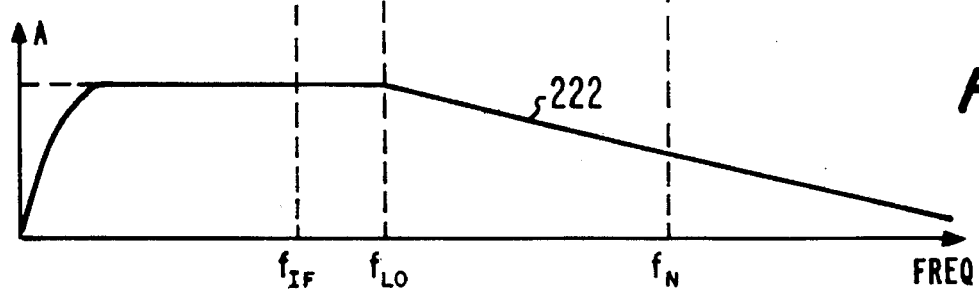
FIG. 2b is an idealized amplitude-frequency plot of the response of a low-pass filter of FIG. 1.

Low-pass filter 52 of FIG. 1 has an amplitude response which is selected to be equal to the open-loop response of main degenerative feedback loop 48, up to a cut-off frequency $f_{CO}$. FIG. 2b illustrates a simplified response 222 of low-pass filter 52, with cut-off frequency of $f_{CO}$, and with the effect of DC blocking capacitor 56 near zero frequency. In general, the response of LPF 52 includes a flat or constant amplitude portion up to the cut-off frequency (frequency at which the amplitude response begins to decrease), which lies somewhat above the IF frequency of FIG. 2a. The Nyquist frequency (one-half of the clock frequency) is illustrated as $f_N$.

Figure 2C:
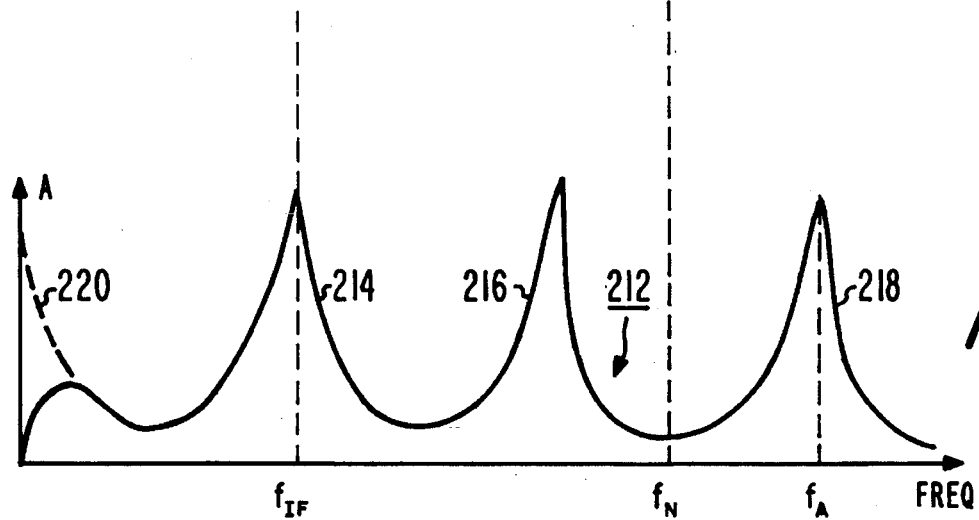
FIG. 2c represents the idealized open-loop gain comb of the regenerative feedback loop of FIG. 1.

Closing of the regenerative loop 50 of FIG. 1 will generate a gain pole at a selected resonance frequency, which is one of a comb of resonance frequencies. The period of the comb, which is the frequency interval between "teeth" of the comb, is the inverse of the delay around the regenerative loop 50, and thus is affected by the delay inherent in the components of the loop, the interconnection conductors of the elements of the loop, and by the time delay of delay element 58. FIG. 2c illustrates the open-loop amplitude-frequency resonant peak response of the regenerative feedback loop 50, in the absence of filters 52 and 54; the response defines a comb response 212 including a selected or first response peak 214 at the IF frequency at which the analog input signal is centered, and two additional response peaks 216 and 218 of the comb. Response peak 218 is illustrated as being centered on a frequency $f_A$. Near zero frequency, response 212 of FIG. 2c decreases to zero amplitude due to the presence of AC coupling capacitor 56. The response in the absence of AC coupling is illustrated by dash line 220. The attenuation of the closed-loop bandwidth above frequency $f_{CO}$ by the characteristics of filter 52, illustrated in FIG. 2b, enhances stability by reducing the importance of the tolerances of components of the continuous-time filters.

Figure 2D:
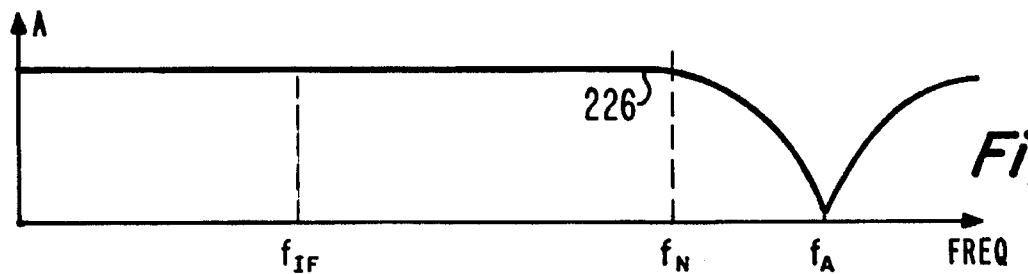
FIG. 2d represents the idealized response of the null filter of FIG. 1.

The response of aliasing resonance null filter 54 of FIG. 1 is illustrated as 226 in FIG. 2d. As illustrated therein, plot 226 exhibits a null at frequency $f_A$, the same frequency at which the third resonant peak 218 of the regenerative response 212 occurs.

Figure 10:
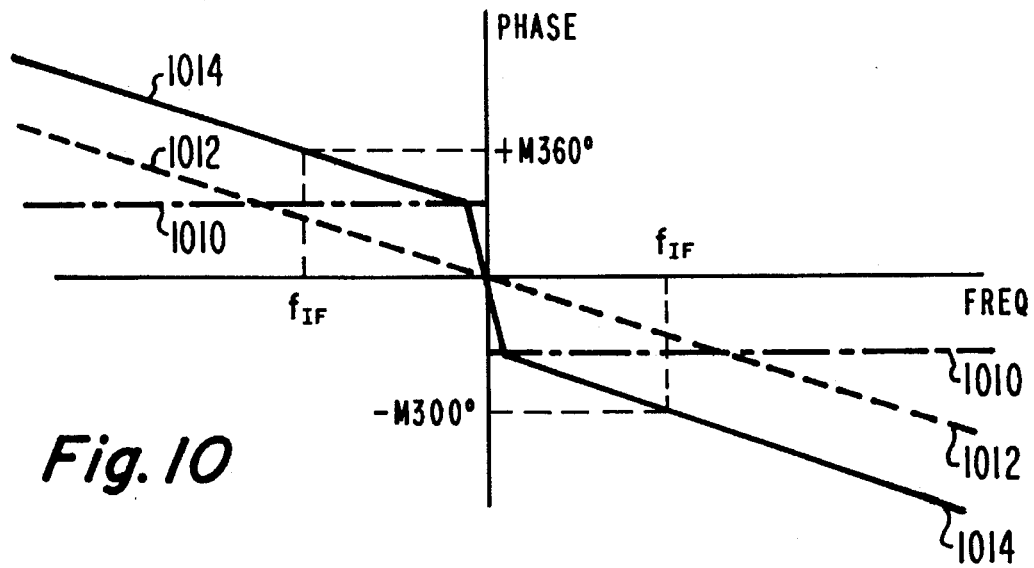
FIG. 10 illustrates a plot of phase versus frequency of a phase shifter which may be used in the arrangement of the invention.

FIG. 10 illustrates a phase versus frequency plot 1010, which represents the step phase shift produced by phase shifter 62 of regenerative loop 50 of FIG. 1. The phase shift φ illustrated by plot 1010 has a constant value above zero Hertz, and a corresponding negative value below zero Hertz. This response is ideally $$H_\phi(j\omega) \approx \frac{1}{2} \left[ ((1 + \text{sign}(\omega))e^{-j\phi} + [(1 - \text{sign}(\omega))e^{j\phi}] \right] = \quad (1)$$

$$\cos(\phi) - j\,\text{sign}(\omega)\sin(\phi)$$

$$\text{where sign}(\omega) = \begin{array}{cc} +1 & \omega > 0 \\ 0 & \omega = 0 \\ -1 & \omega < 0 \end{array}$$

Also illustrated in FIG. 10 is the phase shift 1012 introduced by delay element 58 of FIG. 1, which, as known, slopes with frequency. Plot 1014 of FIG. 10 illustrates the net phase response around the regenerative loop. If the magnitude of the step phase shift is increased, the offset of the net phase shift increases at all frequencies, thereby affecting the frequency at which the resonant loop resonates.

The open-loop gain of the regenerative loop 50 of FIG. 1 is set to unity, and the open-loop phase is set to zero, or to an integer multiple of 360°, at the selected resonance frequency, which in FIG. 2c is the frequency of the first resonance peak 214. However, the selected resonance frequency could be selected to be the frequency of one of the other resonance peaks of the comb, such as peak 216 or peak 218. Setting of the open-loop gain is accomplished by adjusting the gain of loop gain amplifier 60 of FIG. 1, or alternatively by applying a selected amount of attenuation in the regenerative loop. The open-loop phase is set to 0° or to N times 360° by adjusting the combination of the value of delay line 58 and/or the phase of phase shifter 62. The value or magnitude of the delay, without the phase-shifter, establishes the base frequency of the first or lowest-frequency resonance (the frequency of resonance 214 of FIG. 2c), and the frequency increment between each resonance and the next higher resonance (the comb interval). The addition of a phase-shift over and above the delay moves the resonant frequency of the first or lowest-frequency resonance, without changing the interval between each resonance and the next. For purposes of this invention, the term "phase-shift" or "phase-shifter" includes elements or circuits which accept a real-valued signal at their inputs, and which produce real-valued signals at their outputs, with a constant phase value (or constant value of phase shift) therebetween as a function of frequency at frequencies greater than zero Hz. At negative frequencies, these phase shifters mirror the phase response at positive frequencies, but with a negative sign. Such phase shifters may be implemented by all-pass ladders or lattice filters, as known in the art, but the exact method of implementation is not critical.

It should be noted that phase shifter 62 of FIG. 1 is located in both the main and the regenerative loops, but could alternatively be located solely in the regenerative loop, to give individual control to the regenerative loop phase, so long as another phase shifter were to be located solely in the main degenerative loop. In special cases, and especially in higher-order resonators, described below, phase shifter 62 is dispensed with entirely, and the desired phase shift is established by the cumulative phase shifts of the other elements of the main and regenerative loops. This is because the phase shifter circuits introduce phase nonlinearity and magnitude error in the form of phase and nonlinearity and magnitude ripple error over frequency. Each particular higher order arrangement will have a corresponding set of gain and phase error margins, or margins relative to the stable condition of the closed-loop system. Elimination of the phase shifter elements in some of the arrangements assists in meeting the desired gain and phase margins, to thereby improve stability, and also has the advantage of a reduced parts count. In such arrangements lacking phase shifter elements, the gain is set as before, and the required phase of 0° or an integer multiple of 360° is obtained at the desired resonant frequency by the combined phase shifts of the components and ad adjusted delay element.

Figure 2E:
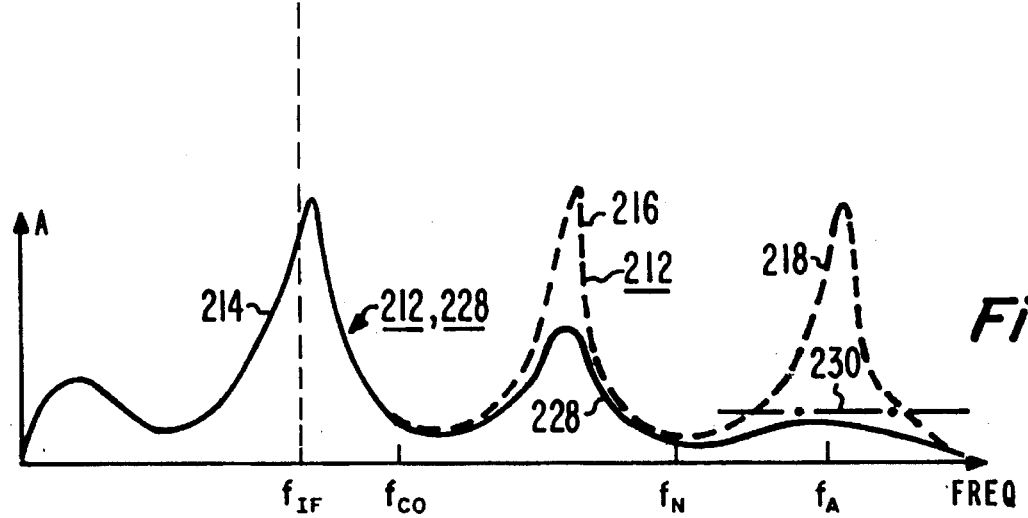
FIG. 2e represents the closed-loop response of the regenerative feedback loop of FIG. 1.

As a result of the sampling operation in ADC 32 of FIG. 1, components above frequency $f_N$ of FIG. 2c will alias to frequencies below $f_N$. This aliasing will produce an effective resonance function other than that illustrated, representing that seen by the closed loop at the output of the ADC 32. The effective resonance will contain undesired gain components, which may affect the stability of the closed-loop sigma-delta ADC 10. Plot 228 of FIG. 2e illustrates an idealized amplitude-vs-frequency response 228 representing the result of combining the regenerative loop response 212 of FIG. 2c with the low-pass filter response 222 of FIG. 2b and the null-filter response 226 of FIG. 2d. The transfer function represented by plot 228 is $$R_{11}(s) = \frac{H_\phi(s)e^{-sT_{D2}}}{1 - GH_\phi(s)H_{B1}(s)H_{B2}(s)e^{-sT_{D1}}} = \frac{N(s)}{1 - B(s)} = \frac{N(s)}{D(s)} \quad (2)$$

where $H_\phi(s)$=Laplace Transform of a Bandpass Phase Shifter Function $H_{B1}(s)$=Laplace Transform of Filter Required to Match Primary Feedback Path $H_{B2}(s)$=Laplace Transform of the Notch Filter For Suppressing the First Resonance above the Nyquist Frequency $f_N$ $e^{-sT_{D1}}$=Laplace Transform of Delay Line which combines with other delays in the regenerative loop to form the entire delay $T_e$ $e^{-sT_{D2}}$=Laplace Transform of Delay Line which combines with component delays in the primary loop to form the entire delay $T_e$ $B(s)=GH_\phi(s)H_{B1}(s)H_{B2}(s)$=open loop response of the regenerative loops.

As illustrated, the effect of the two filters on the regenerative loop response 228 is negligible at frequencies below cutoff frequency $f_{CO}$. Above frequency $f_{CO}$, the cutoff of the low-pass filter progressively attenuates the response, and the resonance peak at $f_A$ is attenuated by the null filter response to a value below unity gain, illustrated as a level 230. This combination of responses tends to reduce all of the unwanted effective resonant peaks of the regenerative loop, restoring a stable condition. To suppress the effect of aliased components, the gain produced by the regenerative loop at frequencies greater than $f_N$ must be suppressed to a level sufficient for stability, which is represented by dot-dash line 230. In the process of transitioning from the desired high gain at the IF frequency to the low loop gain at $f_A$, regenerative peak 216 can have a gain exceeding unity. Thus, plot 228 of FIG. 2e represents the closed-loop regenerative gain of the regenerative loop 50 of FIG. 1.

Figure 2F:
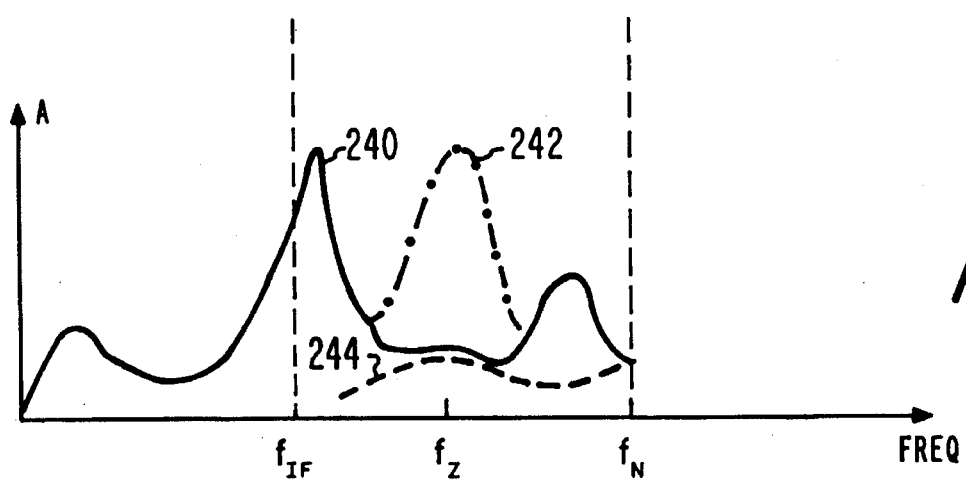
FIG. 2f represents the effective open-loop response of the entire sigma-delta loop.

In FIG. 2f, dot-dash plot 242 represents the open-loop transfer function seen by the closed-loop sigma-delta modulator, in the absence of a cutoff filter response, such as that of plot 222 of FIG. 2B. Plot 242 has an undesired peak at a frequency $f_z$, where $f_z=2f_N-f_A$, as a result of aliasing produced by the ADC and DAC, which sample at $f_S=2f_N$. This aliasing gain peak is undesired because it causes the gain and phase margins to be exceeded, thereby resulting in instability. In FIG. 2f, plot 244 represents the components produced by aliasing of components of plot 228 of FIG. 2e which lie above $f_N$. Plot 244 has a response which is suppressed at all frequencies, attributable at least in part to the cutoff above frequency $f_{CO}$, so that it has negligible effects on system performance. FIG. 2f represents as a plot 240 the effective open-loop response of the entire sigma-delta loop of the arrangement of FIG. 1. The term "effective" is used to indicate the open-loop transfer function seen by the closed-loop sigma-delta modulator, that differs from that of FIG. 2e as a result of the sampling process in the analog-to-digital converter 32 of the loop and the analog reconstruction process in the digital-to-analog converter 38. Plot 240 is the sum of components below $f_N$ of plot 228 of FIG. 2e with components represented by plot 244 of FIG. 2f.

FIG. 3 illustrates the open-loop response of zero order hold 42 of FIG. 1 as a plot 310, the open-loop response of filter 44 as 312, and the combined response from input port 38i of DAC 38 of FIG. 1 to output port 44o of filter 44 as 314. Near zero frequency, the combined response 314 tends toward zero amplitude because of the effects of DC blocking capacitor 46. When both the regenerative loop 50 and the main degenerative loop 48 are closed, two transfer functions develop, a first signal transfer function $H_x(\omega)$, where $\omega$ is $2\pi f/f_S$, between the system signal input port 12 and the system output port $40_O$, and the second noise transfer function, $H_e(\omega)$, between effective noise input port 32n of ADC 32 and system output port $40_O$. Noise transfer function $H_e(\omega)$ will exhibit attenuation at frequencies at which open-loop resonance gain is high, as at frequency $f_{IF}$ of the selected resonance. Thus, the described system tends to reduce noise at signal frequency $f_{IF}$. The signal transfer function $H_x(\omega X)$ exhibits near-unity gain at frequency $f_{IF}$, so the signal is not significantly attenuated, thereby improving the signal-to-noise ratio (SNR) at the system output. Additionally, since $f_{IF}$ can be moved at will by adjustment of the phase shift in the regenerative or resonant loop 50, the band of high SNR can be readily adjusted.

FIG. 4 illustrates the response or performance of the arrangement of FIG. 1 with both the regenerative loop and the main degenerative loop closed. In FIG. 4, the gain of the signal transfer function $H_x(\omega)$ is plotted as dash line 412, and the noise transfer function $H_e(\omega)$ is 410. As illustrated, plot 412 is flat, and has essentially unity signal gain for all frequencies of interest, while plot 410 has a noise null at and near frequency $f_{IF}$.

Equations (3) and (4) represent the general (regardless of order) transfer functions $H_x(\omega)$ and $H_e(\omega)$. where:

$$H_{xp}(s) = -H_{xp}(s) = \frac{[R_{nm}(s)e^{-sT_e}]_p}{1 + [H_r(s)R_{nm}(s)e^{-sT_e}]_p} = \quad (3)$$

$$\frac{N_p(s)}{K_p(s)} = \text{Signal Transfer Function}$$

$H_x(s)$=the signal transfer function of the continuous-time closed loop system;

$R_{nm}(a)$=continuous-time resonator transfer function for a resonator of order n, having m stages of cascading= $N_{nm}(s)/D_{nm}(s)$;

and the additional subscript p indicates sampling rather than continuous time.

$$H_{ep}(s) = \frac{1}{1 + [H_r(s)R_{nm}(s)e^{-sT_e}]} = \quad (4)$$

$$\frac{D_p(s)}{K_p(s)} = \text{Noise Shaping Transfer Function}$$

where:

$H_e(s)$=the noise transfer function of the continuous-time closed-loop system; and subscript p denotes sampling.

In equations (3) and (4), the function $H_r(s)$ represents the combined open-loop response of filters 42 and 44 of FIG. 1, where filter 42 represents switching operations within the digital-to-analog converter. More specifically, this open-loop response is given by $$H_r(s) = H_{ZOH}(s)H_{eq}(s) \quad (5)$$

where $H_{ZOH}(s)$=Laplace Transform of zero order hold DAC reconstruction filter $H_{eq}(s)$=Laplace Transform of Elliptical Filter Required to Equalize the DAC zero order hold to produce a flat channel up to the IF frequency band selected.

Equations (3) and (4) incorporate an aliasing operator denoted by subscripted bracketed functions of the form $[\ ]_p$, where $$[F(s)]_p = k_s \sum_{k=-\infty}^{\infty} F(s - j\omega_s k) \quad (6)$$

and $k_s$ is a gain-normalizing constant. Operator $[F(s)]_p$ produces a periodic spectrum in response to a nonperiodic spectral input function. The periodicity of the aliasing function is $f_S$, the sampling frequency. The effect of the aliasing operator is to sum the shifted components of the input spectrum over Nyquist bands, where Nyquist bands are defined as the spectra ($nf_S-f_N$) to ($nf_S+f_N$), where n is an integer. In equations (3) and (4) one can define an effective resonance transfer function as $$R_{effp}(s) = [H_r(s)R_{nm}(s)e^{-sT_e}]_p \quad (7)$$

Plot 240 of FIG. 2f represents the amplitude component of the effective resonance transfer function. The application of the aliasing operator to the open-loop transfer function combines the primary components of the resonance transfer function and the aliased components above $f_N$ in FIG. 2e. This resonance transfer function is perfectly periodic with frequency. For the first-order system of FIG. 1, the closed-loop transfer function is given by $$H_e(s) = \frac{1 - H_\phi(s)H_{B1}(s)H_{B2}(s)e^{-sT_{D1}}}{1 - H_\phi(s)H_{B1}(s)H_{B2}(s)e^{-sT_{D1}} + H_{eq}(s)H_{ZOH}(s)H_\phi(s)e^{-sT_{para}}e^{-sT_{D2}}} = \frac{D(s)}{K(s)} \quad (8)$$

where $e^{-sT}$para=Laplace Transform of the parasitic delay produced by the components in the primary feedback loop (e.g., Amplifiers, summing nodes, splitting nodes, A/D and DAC)

In equation (8), the numerator produces a null response at the desired resonance frequency $f_{IF}$, as indicated by plot 410 of FIG. 4. In the numerator term, the combined open-loop response of the regenerative loop 50 of FIG. 1 is aligned so that at the frequency of interest $f_{IF}$, the magnitude of the response is unity, and the phase is zero degrees or a multiple of 360°. The denominator term of equation (8) includes the same function as is found in the numerator, plus the response of the open-loop main path 48 of FIG. 1. To achieve stability when the main and regenerative loops are closed, the individual responses of the loops are matched well enough to cancel each other. Equation (8) incorporates a polynomial multiplied by an exponential, and does not necessarily have a discrete solution, as would an equation with discrete poles and zeroes. Equations with discrete poles and zeroes include functions which are polynomials or a weighted sum of exponentials, but not a product of polynomials and exponentials. Thus, stability is not determined or defined by the locations of discrete poles in equation (8), but instead must be defined by a more general stability criterion. Control theory indicates that a return function T(s) can be defined as the denominator of the closed-loop transfer function K(s), minus one, T(s)=K(s)−1. Stability can be determined for such a closed-loop system from a Nyquist diagram of T(s). A Nyquist diagram has the real and imaginary parts of the return function plotted along corresponding mutually orthogonal axes, with s equal to $j\omega$, and $\omega$ swept over all frequencies. Stability is guaranteed when the Nyquist plot so made does not encircle the −1 point on the real axis. Thus, to guarantee stability, the open-loop transfer functions as defined above must be matched well enough in equation (8) to insure this condition. Ideally, when the regenerative and main open loop responses are perfectly matched, the Nyquist diagram will be a point at the origin. Such a response cannot realistically be achieved, but it can be approximated sufficiently for stability. The arrangement according to the invention allows this matching to be achieved in the presence of aliasing, which in turn allows stable sigma delta modulators to be made in which the desired signal gain and noise rejection are achieved at frequencies independent of the sampling rate.

Figure 5:
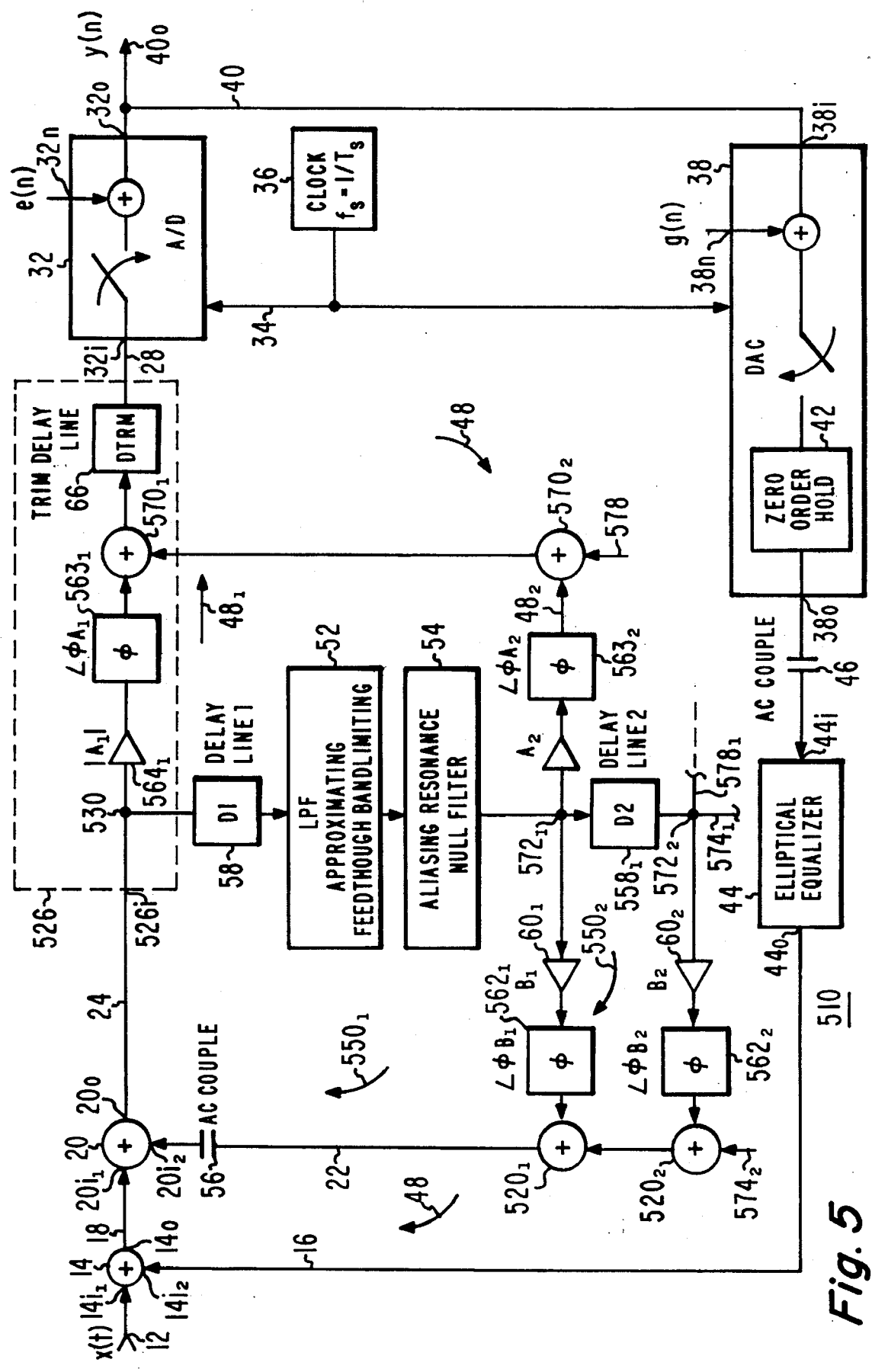
FIG. 5 is a simplified block diagram which illustrates a sigma-delta analog-to-digital converter with a higher-order resonator than the arrangement of FIG. 1, having multiple resonant and degenerative feedback loops.

FIG. 5 illustrates a sigma-delta analog-to-digital converter 510, which includes a higher-order embodiment of the resonator than does the arrangement of FIG. 1. The higher-order resonance structure implements multiple selectable poles and zeroes in the form of a single-stage recursive transversal filter (RTF). The poles are selected to enhance the resonance gain peak at a selected frequency or over a band of frequencies. The zeroes are selected for stability in the closed-loop condition, thereby providing increased attenuation at the frequency or band of frequencies in the noise transfer function $H_e(\omega)$. Elements of FIG. 5 corresponding to those of FIG. 1 are designated by like reference numerals. In FIG. 5, coupling arrangement 526 extending between output port 20$o$ of summing circuit 20 and input port 32$i$ of ADC 32 is different from coupling arrangement 26 of FIG. 1. Coupling arrangement 526 includes an input port 526$i$ coupled to the output port 20$o$ of summing circuit 20, and its third port 530 is coupled directly to its input port 526$i$. Coupling arrangement 526 of FIG. 5 includes a gain element $564_1$, a phase shifter $563_1$, a summing circuit $570_1$, and a time delay element 66, cascaded in the stated order between input port 526$i$ and output port 526$o$. As in the case of the arrangement of FIG. 1, delay element 66 is within the main loop, but is not within a resonant loop. The placement of phase shifter $563_1$ in FIG. 5, on the other hand, is within the main degenerative feedback loop 48, but not within the multiple resonant loops.

The arrangement of FIG. 5 includes multiple regenerative or resonant loops, a first of which is designated $550_1$, and a second of which is designated $550_2$. The first resonant loop $550_1$ includes delay element 58, LPF 52, null filter 54, tap point $572_1$, gain element $60_1$, a phase shifter $562_1$, summing circuits $520_1$ and 20, signal path 24, and third port 530. As mentioned previously in conjunction with FIG. 1, independent phase control of the main loop and a regenerative loop, such as of regenerative loop $550_1$, may be accomplished by means of separate phase shifters in each of the degenerative and main loops. Thus, phase shifter $562_1$ of regenerative loop $550_1$ is matched by phase shifter $563_1$ in a main loop portion $48_1$; thus, degenerative main loop 48 in the arrangement of FIG. 5 includes a plurality of portions, all of which include ADC 32, DAC 38, DC blocking element 46, equalizer 44, path 16, summing circuits 12 and 20, and path 24 to port 530. All of the branches of main or degenerative loop 48 extend from port 30 of coupling circuit 526 to input port 32$i$ of ADC 32. The first branch $48_1$ of the main or degenerative loop 48 includes gain element $564_1$, phase shifter $563_1$, summing circuit $570_1$, and trim delay line 66. The second resonant loop $550_2$ includes delay element 58, LPF 52, null filter 54, tap point $572_1$, delay element $558_1$, tap point $572_2$, gain element $60_2$, a phase shifter $562_2$, summing circuits $520_2$, $520_1$ and 20, signal path 24, and port 530. A corresponding second branch for phase control for the main loop is provided by a path extending from tap port 530 of coupler 526 to input port 32$i$ of ADC 32, which path includes delay line 58 (if provided), LPF 52, null filter 54, tap point $572_1$, a gain control element $564_2$, and a phase shifter $563_2$ cascaded in a path extending between tap point $572_1$ and an input port of summing circuit $570_2$, and also includes summing circuits $570_2$ and $570_1$. As suggested by dash lines $574_1$ and $574_2$ extending from tap point $572_2$ and summing circuit $520_2$, respectively, of FIG. 5, additional resonant loops may be added by extending the recurrent structure of the illustrated resonant loops to further branches. As suggested by dash lines $578_1$ and $578_2$ extending from tap point $572_2$ and summing circuit $570_2$, respectively, additional corresponding branches of the main loop may be added in the same manner.

In equations (3) and (4), the effective resonance transfer functions are denoted by subscripts n and m, where n represents the order of the recursive transversal filter (resonator) of FIG. 5, and m represents the number of cascade stages in the RTF. Thus, m is unity in the case of FIG. 5. For orders (n) greater than one, the effective resonance is given by $$R_{nm}(s) = \frac{\prod_{i=1}^{m} N_i(s)}{\prod_{i=1}^{m} D_i(s)} = \frac{N(s)}{D(s)} = \frac{N(s)}{1 - B(s)} \quad (9)$$

where $$B(s) = \prod_{i=1}^{m} (1 - B_i(s)) - 1; \quad (10)$$

and $$B_i(s) = H_{Bi}(s) H_{oi}(s) \sum_{l=1}^{L_i} B_{li} H_{B_{li}}(s) e^{-slT_e} \quad (11)$$

$$N_i(s) = H_{oi}(s) \sum_{l=1}^{L_i-1} A_{li} H_{A_{li}}(s) e^{-s(l-r)T_e} \quad (12)$$

Figure 6A:
FIG. 6a illustrates a simplified amplitude-frequency spectrum of an analog input signal applied to the ADC of FIG. 5.
Figure 6B:
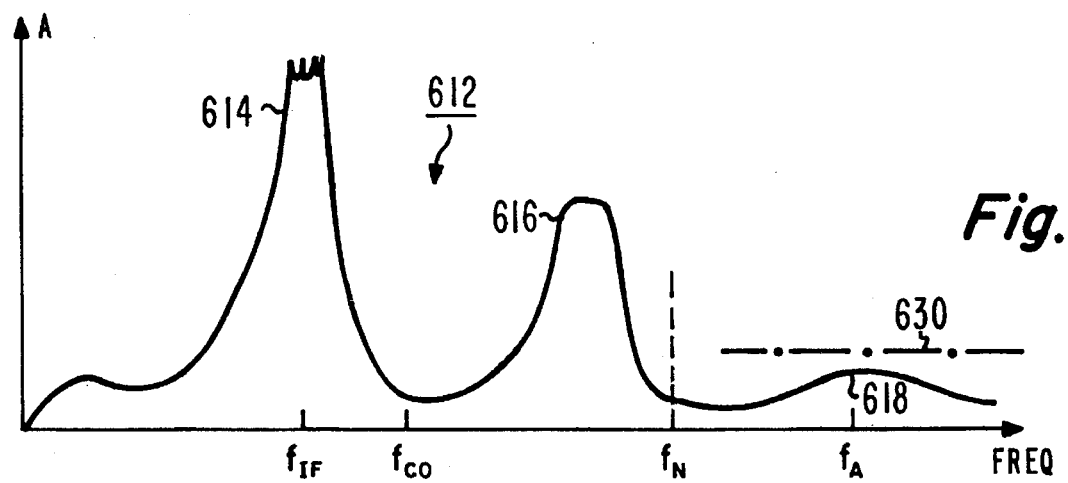
FIG. 6b illustrates the open-loop spectral response 612 of the resonant loops of the arrangement of FIG. 5, as affected by combining the regenerative loop responses with the response of the low-pass filter and the null filter.
Figure 6C:
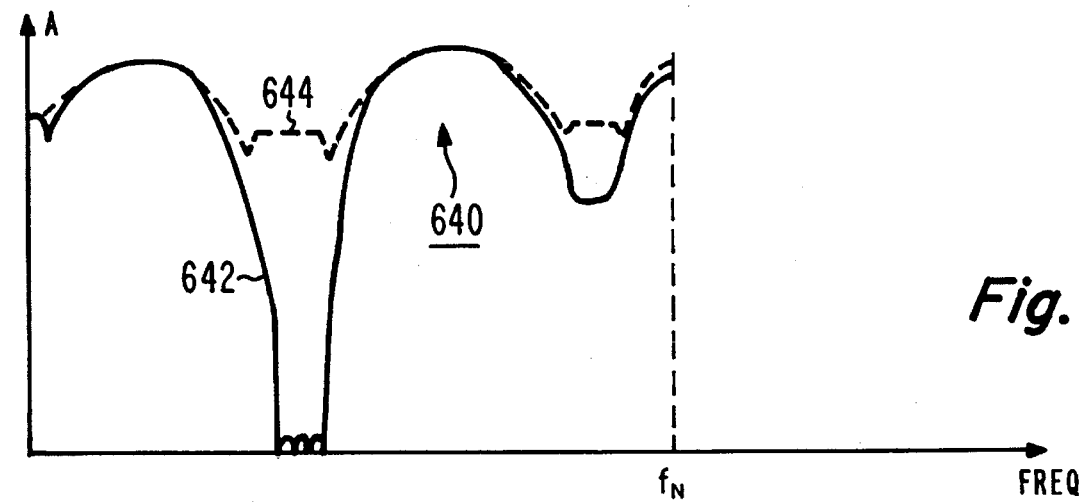
FIG. 6c illustrates the gain of the analog-to-digital converter of FIG. 5, with all the resonant and degenerative feedback loops closed.

This higher order of the effective resonance will produce increased attenuation of noise over a specified bandwidth centered at a desired frequency $f_{IF}$, as shown by plot 642 of FIG. 6c. Stability is insured in the multipole context by a criterion similar to that used in the first-order system, namely that of equation (8). In the multipole context of FIG. 5, the denominator of the closed-loop transfer function is given by $$K(s) = 1 - B(s) + N(s) e^{-s1T_e} \quad (13)$$

so that the return function is given by $$T(s) = N(s) e^{-sT_e} - B(s) \quad (14)$$

To illustrate the above-mentioned stability criterion in relation to equation (14), a selection for the weights used in paths $550_1$, $550_2$, . . . and the weights used in corresponding feedforward paths $48_1$, $48_2$ of recursive transversal filter or resonator 50 of FIG. 5 might be such that the weight of each feedforward path ($48_1$) is equal to the weight of the corresponding feedback path ($550_1$). When this equal-weight condition prevails, the idealized closed-loop noise transfer function exhibits a finite-impulse-response (FIR) characteristic such that a Nyquist diagram of the response is represented as a point at the origin. Mismatches are to be expected between the functions N(s) and B(s), arising from the actual, as opposed to theoretical, performance of the bandlimiting filters 42, 44, 52, and 54 of FIG. 5, and from gain and phase variation of components (amplifiers, attenuators, delay lines, etc. which are used. Note that it is not possible to ascribe the function N(s) solely to filters 42 and 44, because filters 52 and 54 affect N(s). Thus, in practice the stability of the arrangement of FIG. 5 is guaranteed by requiring adequate matching of the filter characteristics, to avoid encirclement of the point −1 on the real axis of the Nyquist diagram when the weighting is applied. Once the bandlimiting filters have been designed for stability using FIR weighting in the RTF as described above, the FIR filter weighting can be replaced by IIR weighting, and stability is maintained.

Figure 7A:
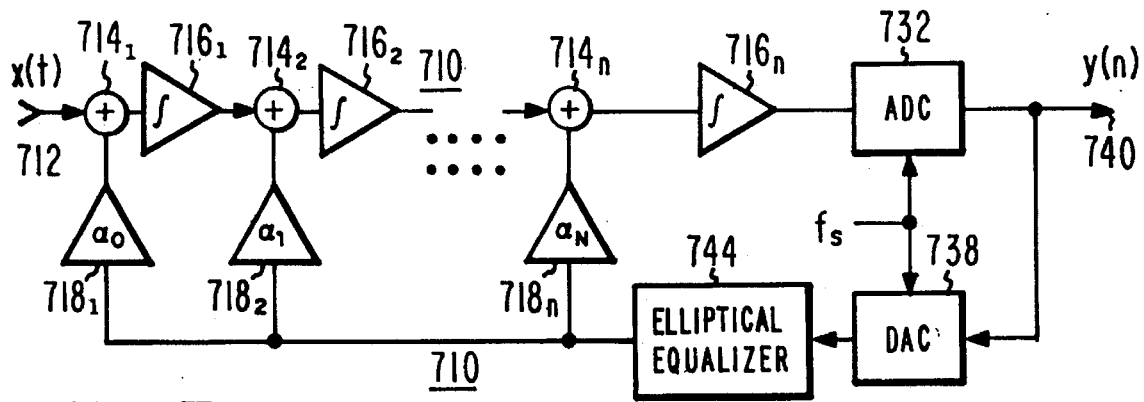
FIG. 7a represents a prior-art sigma-delta analog-to-digital converter in which integrators provide frequency-selective gain.
Figure 7B:
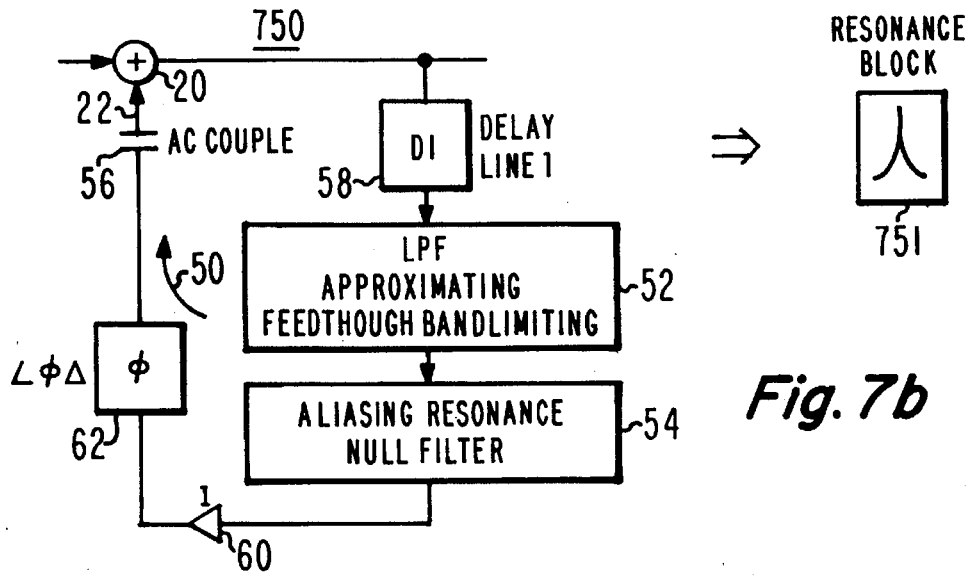
FIG. 7b illustrates a resonator portion of the arrangement of FIG. 1, and a symbol representing that portion.
Figure 7C:
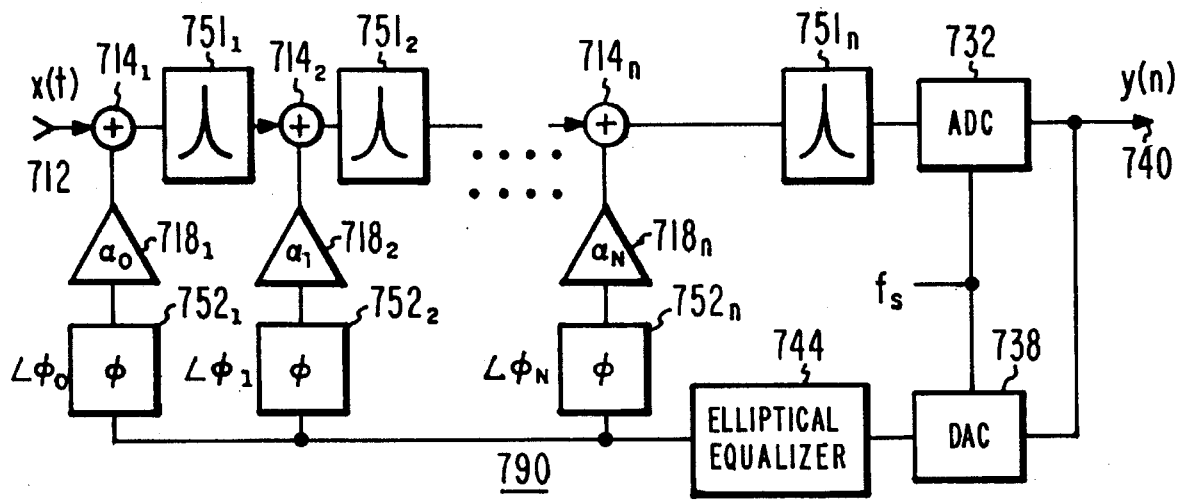
FIG. 7c illustrates the arrangement of FIG. 7a with each of its integrators replaced by the resonator of FIG. 7b, and with other modifications in accordance with the invention.

FIG. 6a illustrates an amplitude-frequency spectrum of an analog input signal 610 centered at a frequency $f_{IF}$, which may be applied to the sigma-delta analog-to-digital converter 510 of FIG. 5. FIG. 6b illustrates the open-loop spectral response 612 of the resonant loops $550_1, 550_2, \ldots$ of the arrangement of FIG. 5, as affected by combining the regenerative loop responses with the response of low-pass filter 52 and the response of null-filter 54. As illustrated, response 612 includes a multiple-pole gain peak 614, resulting from the multiple resonant poles, extending over a bandwidth about $f_{IF}$ which includes the analog frequencies. This open-loop gain peak, when both the regenerative and degenerative loops are closed, results in low through loss at the signal frequencies. Plot 612 also includes additional poles 616 and 618, in which pole 616 is below the Nyquist frequency $f_N$, and pole 618, which is above the Nyquist frequency, has a gain of less than the maximum stable gain, which is represented by line 630. FIG. 6c illustrates by a plot 640 the gain of the analog-to-digital converter 510 of FIG. 5, with all the resonant and degenerative feedback loops closed. The solid-line plot 642 of FIG. 6c represents the response of the loop on noise e(n) injected into port 32n of ADC 32 of FIG. 5, with a multipole null centered on frequency $f_{IF}$, to suppress the noise at system output path 40. The dash-line path 644 illustrates the overall gain response of the sigma-delta analog-to-digital converter 510 to the signal. As illustrated, the signal gain is much greater than the gain applied to the noise. Ideally, the signal gain is unity. As described above in relation to FIG. 1, the multiple resonant frequencies at which the noise rejection is high in null 642 of FIG. 6c can be adjusted by selecting the time delays of delay elements 58, 66, $558_1, \ldots$, and, in pairs, the phase shifts of phase shifters $562_1, 563_1; 562_2, 563_2; \ldots$ FIG. 7a represents a prior-art sigma-delta analog-to-digital converter 710, in which analog input signal is applied to an input port 712, and which includes a cascade of summing circuits $714_1, 714_2, \ldots 714_n$, interspersed with integrators $716_1, 716_2, \ldots 716_n$ coupling the input port 712 to an ADC 732. The system digital output signal appears at system output port 740, and is applied to a DAC 738. The digital output of DAC 738 is applied to an amplitude equalizer 744. The equalized analog signal from equalizer 744 is applied by way of a plurality of branching gain weights $718_1, 718_2, \ldots 718_n$ to their respective summing circuits $714_1, 714_2, \ldots 714_n$. FIG. 7b is a simplified block diagram of a single-loop resonator loop 750 similar to loop 50 of FIG. 1, which includes delay element 58, low-pass filter 52, null filter 54, gain element 60, DC blocking element 56, and summing circuit 20. As illustrated in FIG. 7b, loop 750 also includes phase shifter 62 in signal path 22. FIG. 7b also illustrates a symbol 751, which represents the entire circuit configuration 750. FIG. 7c illustrates an ADC 790, which is the prior-art arrangement of FIG. 7a, with the integrators $716_1, 716_2, \ldots 716_n$, according to an aspect of the invention, replaced by elements $751_1, 751_2, \ldots 751_n$, each corresponding to the resonator arrangement of FIG. 7b. Also in the arrangement of FIG. 7c, each branch gain weight $718_1, 718_2, \ldots 718_n$ is cascaded with a corresponding phase shifter $752_1, 752_2, \ldots 752_n$. In the arrangement of FIG. 7c, the sigma-delta analog-to-digital converter 790 achieves its noise rejection at the multipole resonance peaks provided by the resonators $751_1, 751_2, \ldots 751_n$.

Figure 8A:
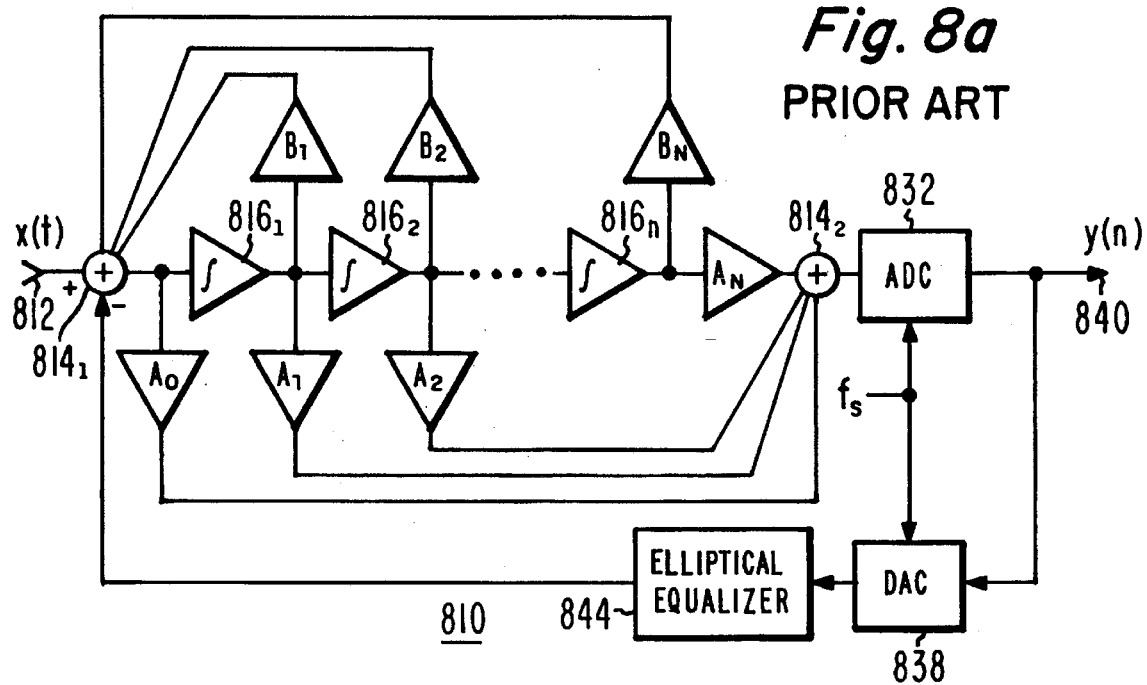
FIG. 8a represents another prior-art sigma-delta analog-to-digital converter in which integrators provide frequency-selective gain.
Figure 8B:
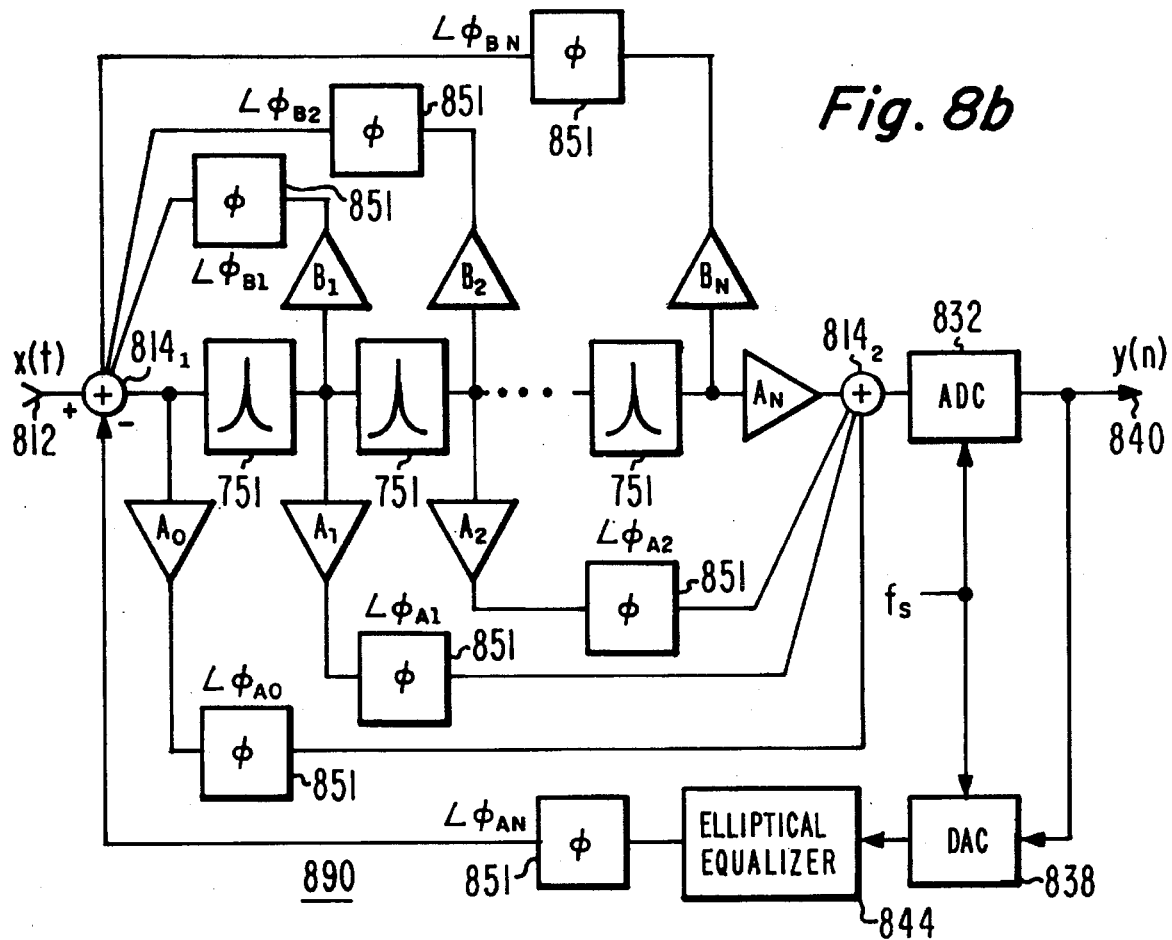
FIG. 8b illustrates the arrangement of FIG. 8a with each of its integrators replaced by the resonator of FIG. 7b, and with other modifications.

FIG. 8a represents another prior-art sigma-delta analog-to-digital converter 810 in which integrators provide frequency-selective gain. In FIG. 8a, analog signals applied to an input port 812 are coupled to a summing circuit $814_1$. The output of summer 814 is applied through a cascade of integrators $816_1, 816_2, \ldots 816_n$ to a second summing circuit $814_2$, and from thence to an ADC 832. The digital output signal appears at system output port 840, and is also applied to a DAC 838. The analog signal produced by DAC 838 is applied by way of an amplitude equalizer 844 back to summer $814_1$, to thereby form a degenerative loop. The output of each integrator $816_1, 816_2, \ldots 816_n$ is coupled by a gain or weighting element $B_1, B_2, \ldots B_n$, respectively, back to summer $814_1$, to thereby close a plurality of regenerative loops. The input of each integrator $816_1, 816_2, \ldots 816_n$ of FIG. 8a is coupled to summing circuit $814_2$ by a gain or weighting element $B_1, B_2, \ldots B_n$, respectively, to thereby close multiple degenerative feedback loops. FIG. 8b illustrates an ADC 890 similar to the arrangement of FIG. 8a, with each of its integrators $816_1, 816_2, \ldots 816_n$ replaced by the resonator 751 of FIG. 7b, with a phase shifter 851 cascaded with each gain or weighting element, and with another such phase shifter 851 cascaded with equalizer 844. The resonators of FIG. 8b provide noise attenuation at the multiple resonator poles. Naturally, the phase shifters 851 may provide different phase shifts to select the desired poles and zeroes.

Figure 9A:
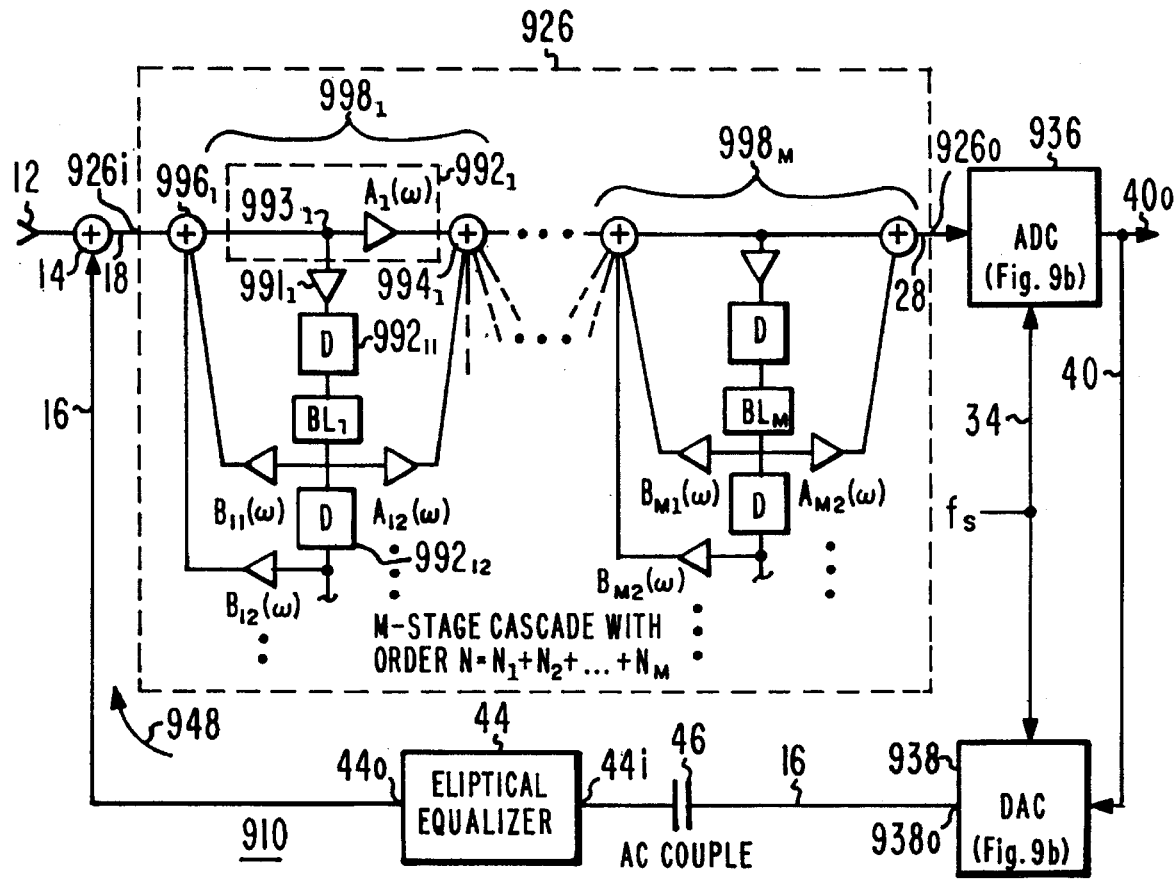
FIG. 9a is a diagram in block and schematic form, of a sigma-delta analog-to-digital converter according to an aspect of the invention, which includes a recursive transversal filter.
Figure 9C:
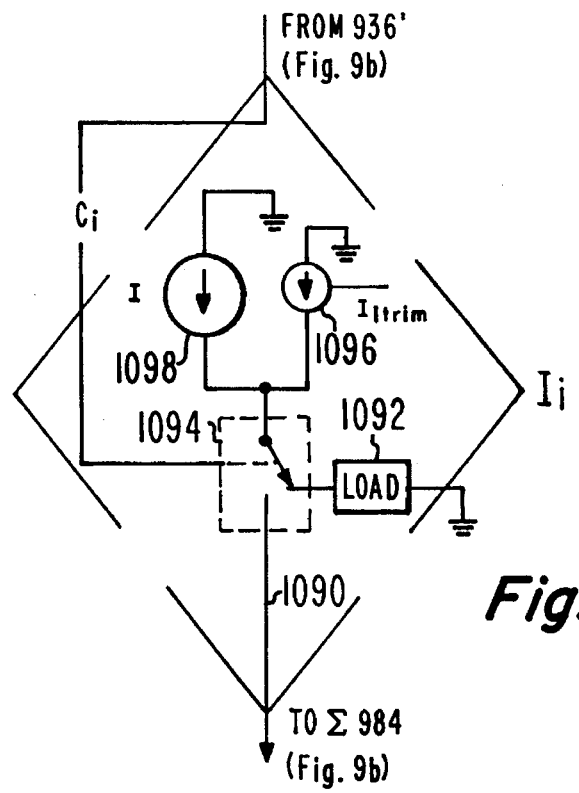
FIG. 9b illustrates details of a particular embodiment of the arrangement of FIG. 9a, and FIG. 9c illustrates details of a controllable current source of FIG. 9b.
Figure 9B:
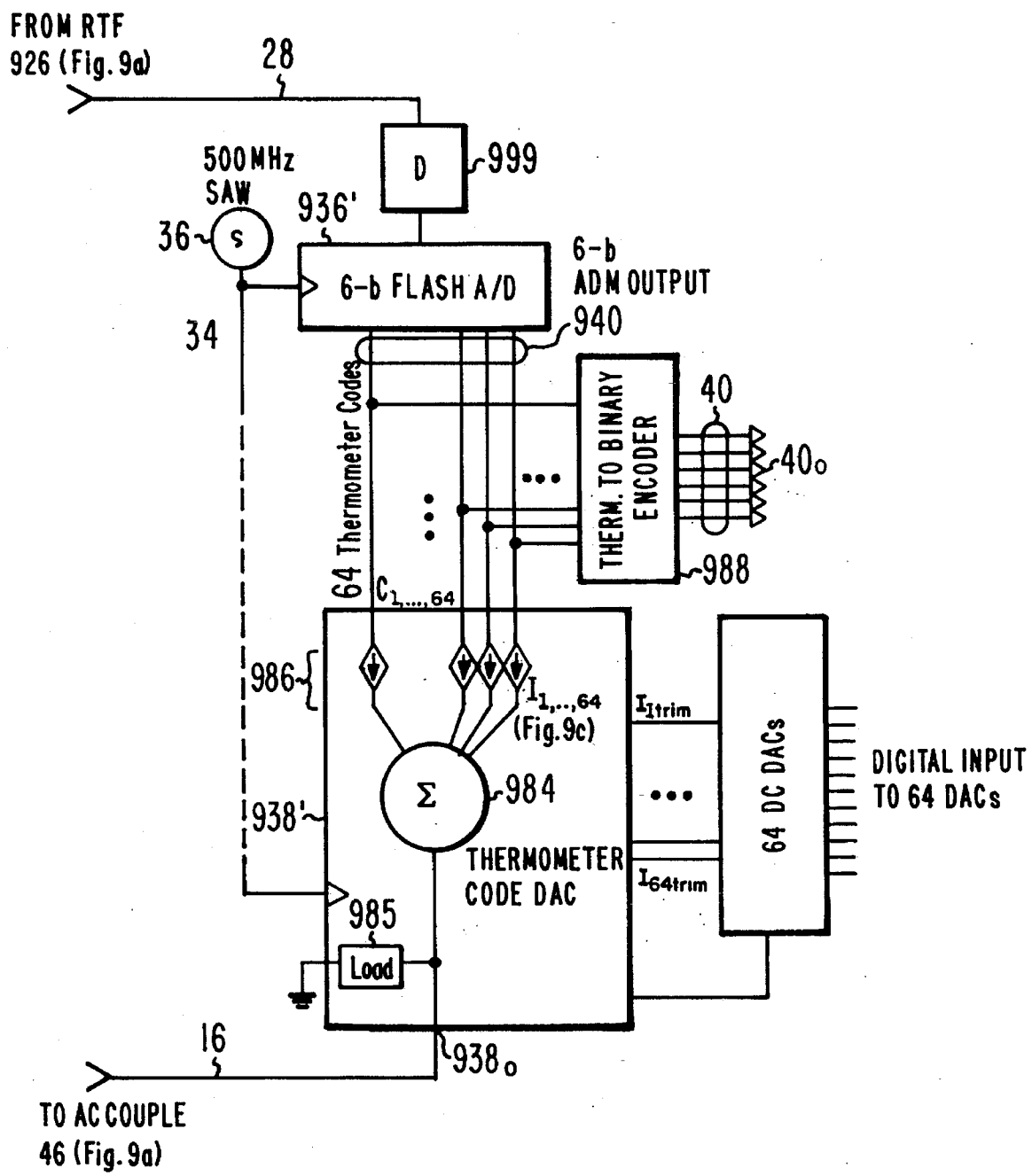

FIGS. 9a, 9b and 9c together illustrate a particular embodiment of a sigma-delta analog-to-digital converter according to the invention. In the arrangement of FIG. 9a, elements corresponding to those of FIG. 1 are designated by like numerals. Band-limited signals are applied to an input port $14i_1$ of a first summing circuit 14 of FIG. 9, and are summed with signals applied to a second input port $14i_2$. The summed signals are applied to a first input port 926i of a continuous-time recursive transversal filter (RTF) 926. The signals filtered by filter 926 appear at an output port 926o, and are applied over signal path 28 to an ADC 936, which digitizes the analog signal, and applies the digitized signal to system output port $40_o$ and to a DAC 938. DAC 938 converts the digital signal to analog form and applies the reconstituted analog sign from its output port 938o by way of DC blocking element 46, equalizer 44, and path 16 back to summing circuit 14, to close a main degenerative loop 948. Details of ADC 936 and DAC 938 are described below in conjunction with FIGS. 9b and 9c.

Recursive transversal filter 926 of FIG. 9a includes a plurality of cascaded multipole resonators, two of which are designated $998_1$ and $998_M$. Resonator $998_1$ is taken as typical. Resonator $998_1$ includes input and output summing circuits $996_1$ and $994_1$, respectively, with a coupling path $992_1$ extending therebetween. Coupling path $992_1$ includes a tap port $993_1$ and a main-loop gain element $A_1(\omega)$ coupled between tap port $993_1$ and output summing circuit $994_1$. Resonator $998_1$ also includes a DC blocking low-pass filter and null filter, illustrated together as a $BL_1$ block, and optionally includes a discrete delay (D) element $992_{11}$ and gain element $991_{11}$. The output of filter $BL_1$ is applied to a weighting element $B_{11}(\omega)$, which couples back to input summing circuit $996_1$ of resonator $998_1$, to thereby close a first regenerative loop. A second degenerative loop portion coupled between the output of filter $BL_1$ and output summing circuit $994_1$ includes weighting element $A_{12}(\omega)$. A corresponding second portion of the regenerative loop includes a delay element $992_{12}$, and a weighting element $B_{12}(\omega)$ coupled between the output of filter $BL_1$ and an input port of summing circuit $996_1$. Those skilled in the art will recognize the structure of resonator $998_1$ as being like that of the resonator $550_1$, $550_2$, . . . of FIG. 5. The cascade within recursive transversal filter 926 of FIG. 9a, then, is seen to be the cascade of a plurality of multipole resonators. In describing a single resonator $998_1$ of FIG. 9a, summing circuit $994_1$ has been described as being part of that resonator; when cascaded, however, each of the summing circuits lying "between" resonators can advantageously receive signals from the two adjacent resonators, so as to perform summing functions in each of two resonators.

FIG. 9b illustrates details of the particular embodiment of the invention of FIG. 9a. In FIG. 9b, the analog input signal from RTF 926 is applied over signal path 28, by way of a trim delay line 999, to a six-bit flash analog-to-digital converter 936'. ADC 936' is clocked by a 500 Mhz clock signal from a surface acoustic-wave (SAW) oscillator 36, and converts the analog signal into "thermometer" codes $C_{1\ldots64}$ on 64 lines of bus 940. Such a thermometer code represents one of sixty-four values by a logic high on all lines equal to or less than the value. The thermometer codes are applied to a thermometer-to-binary encoder 988, which converts the thermometer codes to binary codes at system output signal port $40_o$. The thermometer codes are also applied from bus 940 to a thermometer code DAC 938', which reconstitutes the analog signal at its output port $938_o$.

Within DAC 938' of FIG. 9b, the signal $C_i$ each conductor or line of bus 940 is applied individually to a single switchable current source I of an array 986 of switchable current sources $I_{1,\ldots,64}$. Each current source I produces the same current. The outputs of the current sources I of array 986 are applied to a current summing ($\Sigma$) circuit 984, which applies the summed currents to a load impedance 985 to produce the desired analog output signal at analog signal output port 938o. FIG. 9c is a simplified diagram of a single current source I of DAC 938' of FIG. 9b. In FIG. 9c, a main current source 1098 is coupled in parallel with a trim current source 1096, and the combined current is applied to a switch, illustrated by a mechanical switch symbol 1094. Those skilled in the art know, however, that solid-state switches are meant by this symbol. Switch 1094 is controlled by the input signal $C_i$. In the illustrated position of switch 1094, the current sources are coupled to a load 1092, and no current is coupled to current source output port 1090. When ADC 936' of FIG. 9c receives a logic high on the particular input line $C_i$ of the current source of FIG. 9c, switch 1094 switches to its alternate position (not illustrated), and the sum of the current from current sources 1096 and 1098 is output from port 1090 to an input of current summer 984 of FIG. 9b.

Figure 11:
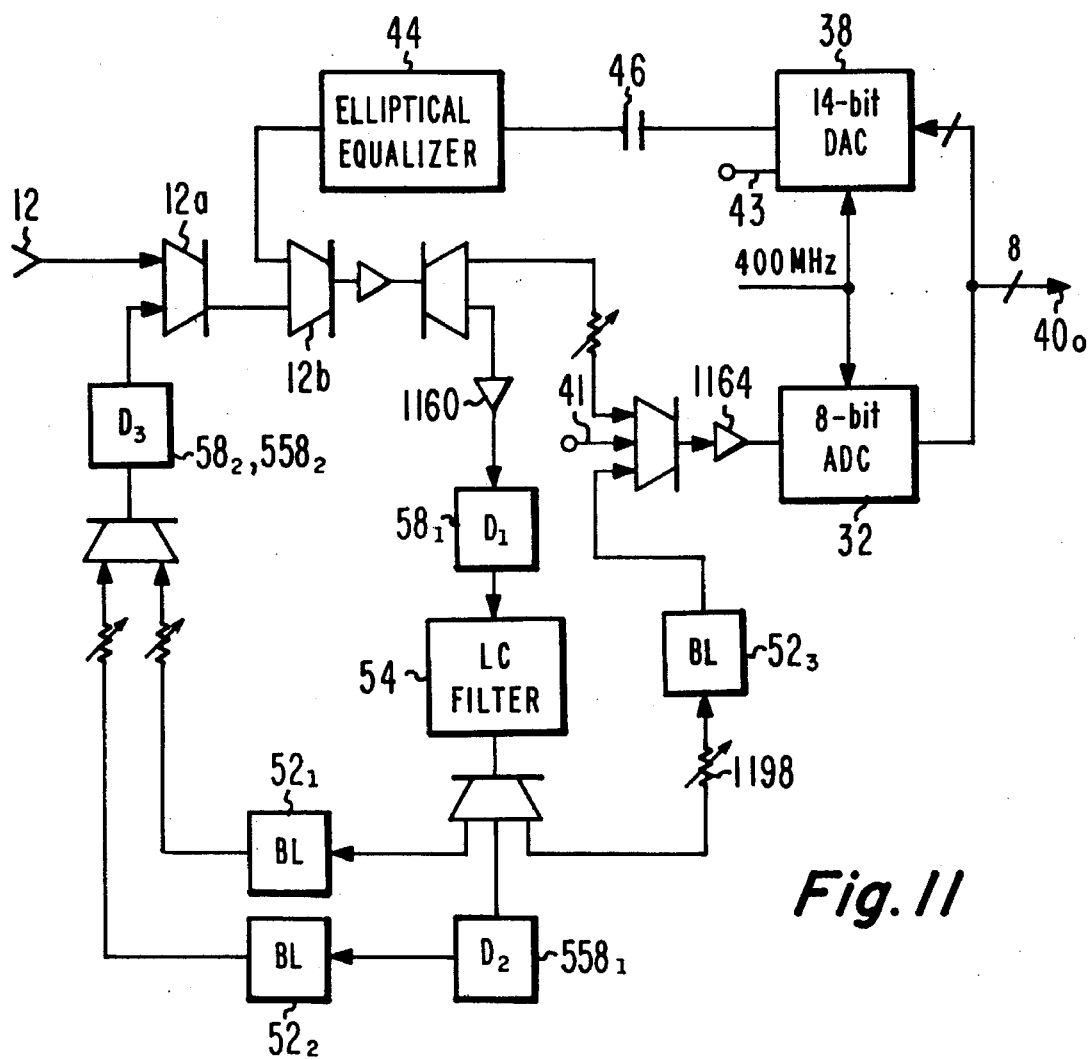
FIG. 11 is a simplified schematic and block diagram of an actual embodiment of the invention.

FIG. 11 is a simplified schematic and block diagram of an actual embodiment of the invention, corresponding to the arrangement of FIG. 5. The arrangement of FIG. 11 includes some minor structural alterations to accommodate the RF frequencies. More particularly, summing circuits 12 and 14 of FIG. 5 are implemented as RF splitter-combiners 12a and 12b, and certain nodes of the arrangement also include such splitter-combiners, to avoid impedance mismatch. The gain control is provided in the arrangement of FIG. 11 by amplifiers 1160 and 1164, together with voltage-actuated PIN diode attenuators, illustrated by variable-resistor symbols, one of which is designated 1198. Also in the arrangement of FIG. 11, delays in the regenerative loop are provided by delay elements $58_1$, $58_2$, and $558_1$. Phase control in each branch portion of the regenerative loop is provided by BL blocks $52_1$ and $52_2$, which also incorporate the LPF and null filter functions. Ports 41 and 43 are input and output test port, respectively.

Figure 12A:
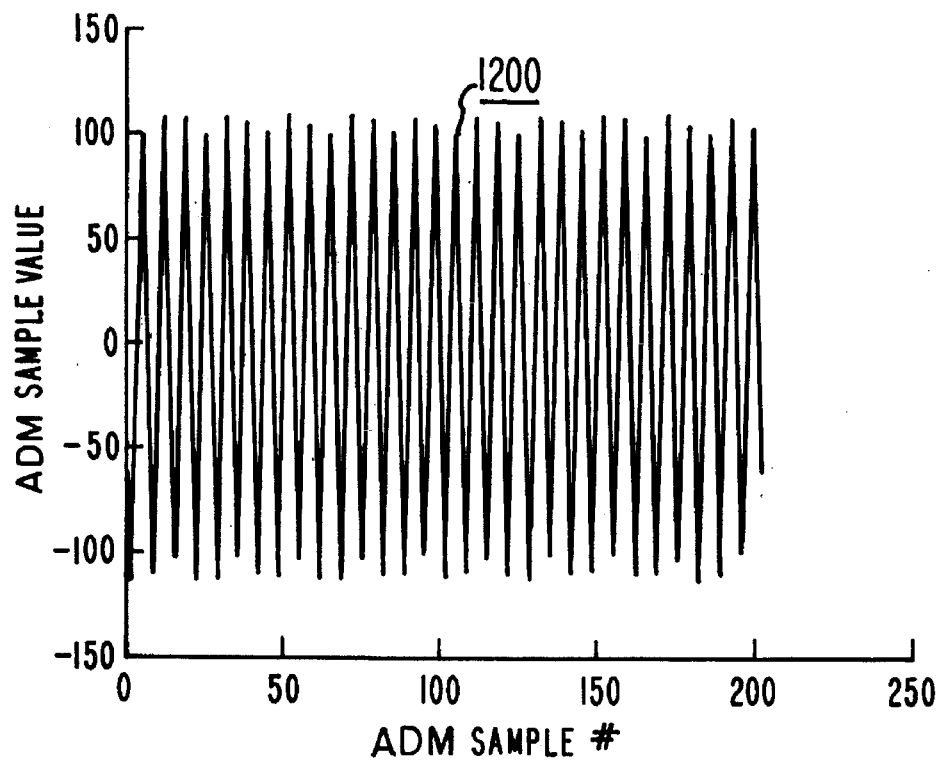
FIG. 12a is an amplitude-time plot of the output signal of a portion of the arrangement of FIG. 11.
Figure 12B:
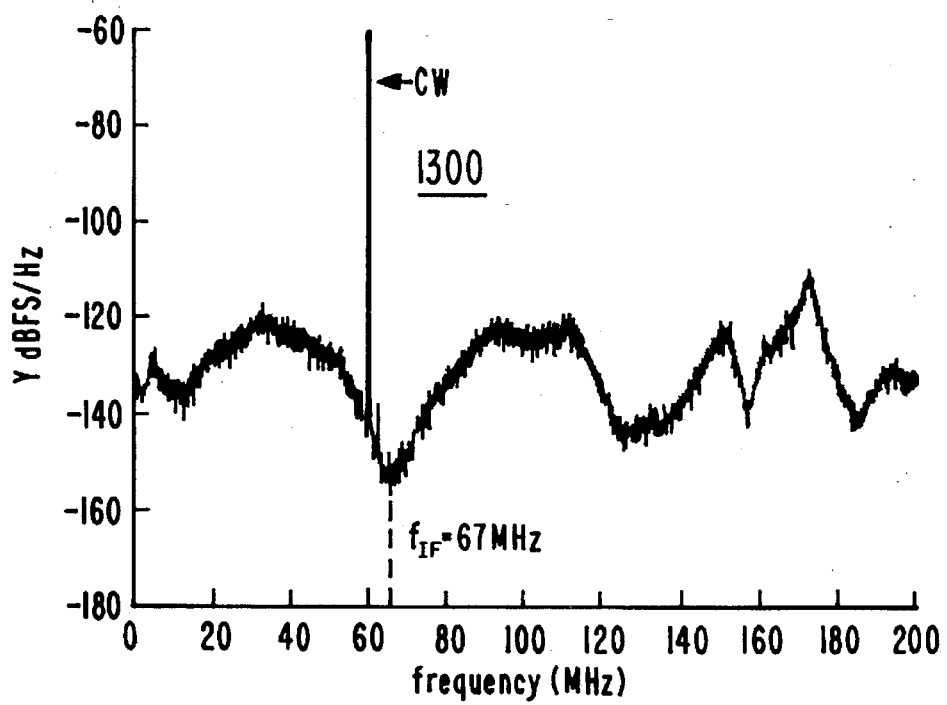
FIG. 12b represents the amplitude-versus-frequency spectrum of the signal of FIG. 12a, FIGS. 12c and 12d represent the same signals as FIGS. 12a and 12b, respectively, in the absence of a signal input.
Figure 12C:
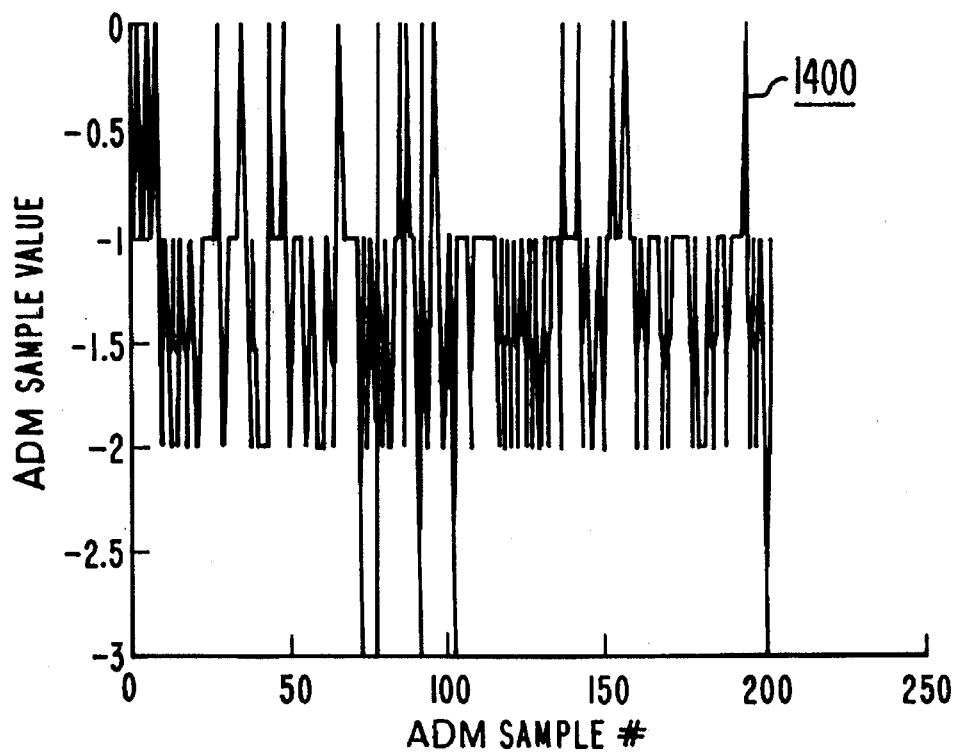
FIG. 12e is a plot of the noise when bits of lower significance of the ADC of FIG. 11 are disconnected.
FIG. 12f illustrates a plot resulting from a frequency sweep from 1 MHz to 200 MHz of the noise shaping filter of FIG. 11, and FIG. 12g plots noise figure against frequency for a portion of the arrangement of FIG. 11.
Figure 12D:
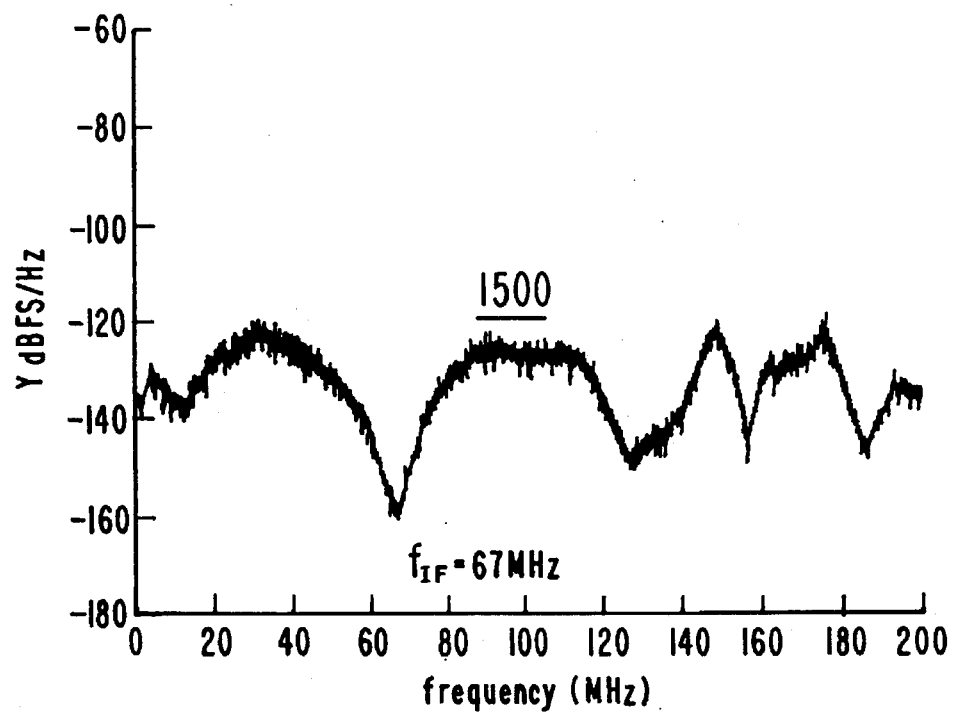

FIGS. 12a through 12g illustrate data taken on the embodiment of FIG. 11. FIG. 12a is an amplitude-time plot of the output signal $40o$ of the eight-bit, 400 Mhz ADC of FIG. 11 in the presence of a full-scale input signal at the input 12. The output $40o$ is termed the Amplitude Density Modulated signal or ADM in FIG. 12a. In FIG. 12a, the full-scale value is ±127, and one quantum or step corresponds to the least-significant bit of the ADC 32. FIG. 12b represents the amplitude-versus-frequency spectrum of the signal of FIG. 12a; in making the plot, the full-scale CW signal was centered in the response of a 60 Mhz bandpass crystal filter in order to suppress phase noise of the CW source to −170 decibels relative to full-scale, per Hertz (dBfs/Hz), thus allowing measurement of the ADC noise floor centered in the noise shaping band centered at $f_{IF}=67$ Mhz. The noise level at 67 Mhz is illustrated as −153 dBfs/Hz over a 5 Mhz band. This performance corresponds to an SNR of 86 dBfs over the band. The plot of FIG. 12b was made with a 16384 point FFT of ADM samples, computed ten times from ten separate data sets, and power averaged to represent the average spectrum between 0 and 200 Hz. The plot is normalized so that each 24.4 Mhz noise bin shows the equivalent noise in units of dB below full scale in a one-hertz bandwidth. FIGS. 12c and 12d represent the same signals as FIGS. 12a and 12b, respectively, in the absence of a signal input. Note that the amplitude scale of FIG. 12c differs from that of FIG. 12a. The low-amplitude dither signal illustrated in FIG. 12c is produced by the closed feedback loop in conjunction with the ADC. The spectrum of FIG. 12d shows reduced noise at the noise shaping IF frequency of 67 Mhz by comparison with FIG. 12b, and corresponds to an average of −160 dBfs/Hz, giving a dynamic range of 93 dB full scale.

Figure 12G:
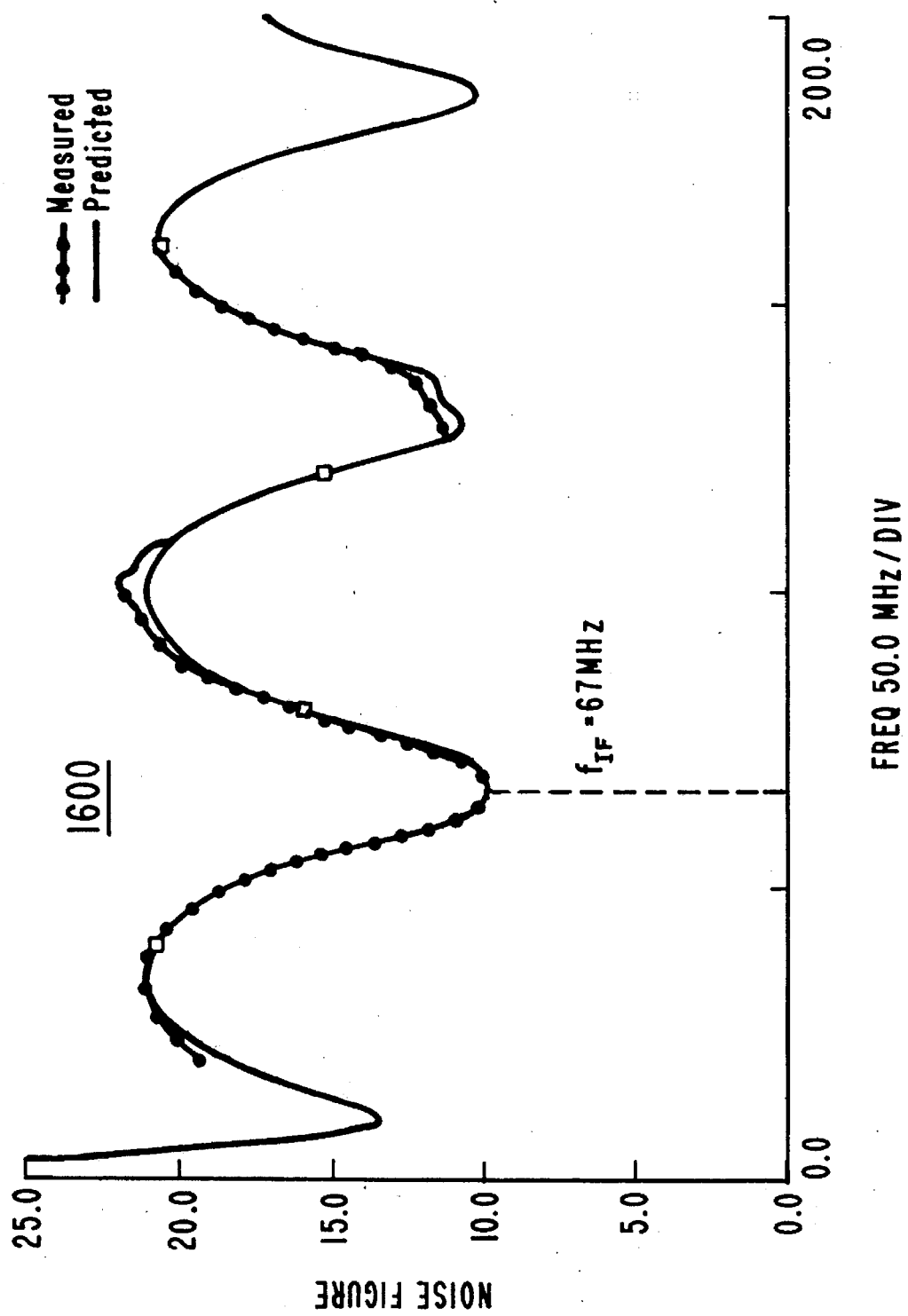
Figure 12E:
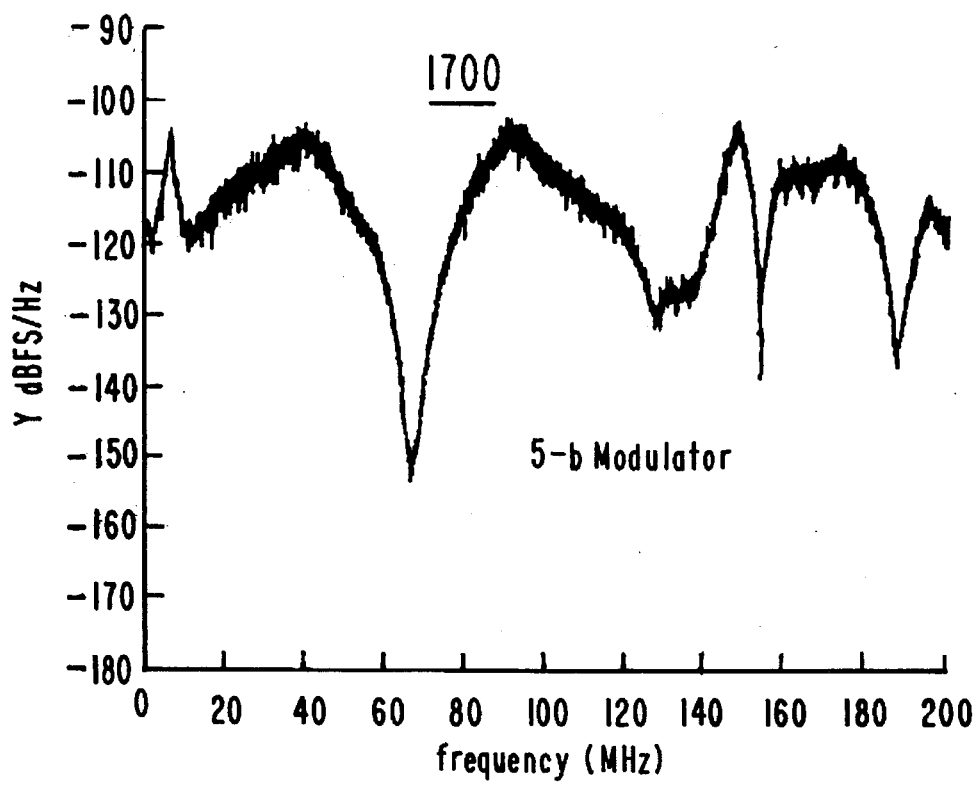
Figure 12F:
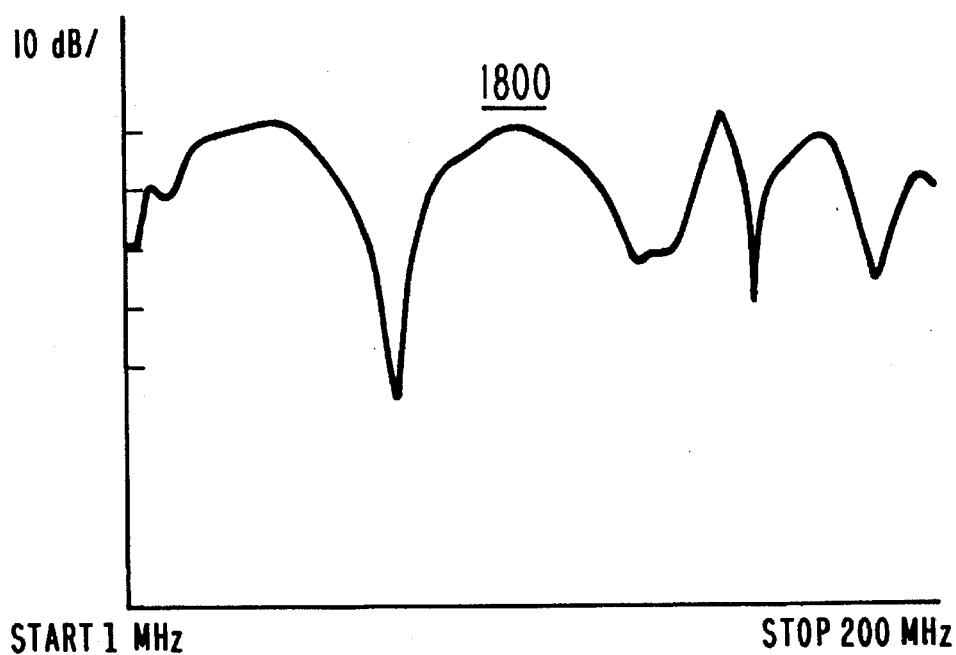

FIG. 12e is a plot of the noise when the eight-bit ADC of FIG. 11 has its three least-significant bits disconnected. FIG. 12f illustrates a plot resulting from a frequency sweep from 1 MHz to 200 MHz of the closed-loop noise shaping transfer function produced by FIG. 11, made by a network analyzer between ports 41 and 43. FIG. 12g plots noise figure of the RTF of FIG. 11 against frequency; the solid line represents the calculated values, and the dotted line represents measured values. The 10 dB noise figure over a 5 MHz band at 67 MHz, together with a full-scale input level of 7 dBm suggests that the RTF limits SNR to 104 dBfs. The observed SNR is 86 dBfs over 5 MHz. This observed limitation of SNR is believed to be attributable to nonlinearities of the DAC, and that a more linear DAC would result in achieving a SNR limited only by RTF noise.

Other embodiments of the invention will be apparent to those skilled in the art. In particular, the prior-art arrangement of FIG. 7a may have each of its integrators $716_x$ (where the subscript x represents all numerical subscripts) replaced by a multipole resonator 950 of FIG. 9 instead of by single-pole resonator of FIG. 7b, or the prior-art arrangement of FIG. 8a may have each of its integrators $816_x$, replaced by a multipole resonator 950 of FIG. 9 instead of by single-pole resonator of FIG. 7b, and similarly, each of the resonators $950_x$ of FIG. 9 may be replaced by a single-pole resonator 751. Also, for example, the delay line 58, low-pass filter 52, aliasing null filter 54, gain element 60, and DC blocking element 56 of FIG. 1 may be cascaded in any order in the regenerative loop. Similarly, gain element 64 and delay element 66 may be at any location in the main degenerative feedback loop of FIG. 1. Phase shifter 62 in the location illustrated in FIG. 1 is within both the regenerative and degenerative loops, and its function may be accomplished by two separate phase shifters, one in each loop. While the analog signal has been described as centered at an IF frequency, those skilled in the art know that any other frequency may be the center frequency.

What is claimed is:

1. A sigma-delta analog-to-digital converter for converting band-limited analog input signals into digital form, said converter comprising:

analog summing means including a first input port coupled to receive said analog input signals which are to be converted, and also including second and third input ports, and an output port at which sum signals are generated which represent the sum of said analog input signals with signals applied to said second and third input ports of said analog summing means;

analog-to-digital conversion means including an input port, an output port, and a sampling clock input port, for converting analog signals applied to its input port into digital signals at its output port, at the frequency of said clock input, said analog-to-digital conversion means being subject to noise, and also being subject to aliasing for frequencies of said analog signals applied to said input port which lie above a Nyquist frequency equal to one-half of the frequency of said clock input;

digital-to-analog conversion means including an input port coupled to said output port of said analog-to-digital conversion means, and also including an output port and a sampling clock input port, for converting digital signals applied to its input port into analog signals at its output port, at the frequency of said clock input, said analog signals at said output port of said digital-to-analog conversion means being subject to unwanted amplitude variations below a cutoff frequency, said cutoff frequency lying between said Nyquist frequency and a selected resonance frequency from a comb of periodic resonance frequencies;

clock means coupled to said clock input port of said analog-to-digital conversion means and to said clock input port of said digital-to-analog conversion means, for clocking said digital-to-analog conversion means and said analog-to-digital conversion means at said clock frequency, whereby said analog-to-digital conversion means and said digital-to-analog conversion means both generate alias components;

first coupling means including an input port coupled to said output port of said summing means, an output port coupled to said input port of said analog-to-digital conversion means, and also including a third port, for coupling signals from said summing means to said analog-to-digital conversion means, and for coupling a sample of said signals traversing said first coupling means to said third port of said first coupling means;

amplitude equalizing means including an input port and an output port, having an equalizing response selected for tending to reduce said unwanted amplitude variations with frequency of said digital-to-analog conversion means, and for preferentially attenuating components at frequencies greater than said cutoff frequency;

DC blocking means coupled to said output port of said digital-to-analog conversion means, to said input and output ports of said amplitude equalization means, and to said second input port of said summing means, for coupling said output port of said digital-to-analog conversion means by a first path to said input port of said amplitude equalization means, and for coupling said output port of said amplitude equalization means by a second path to said second port of said summing means, at least one of said first and second paths providing only AC coupling, thereby closing a main degenerative feedback loop having a main loop gain and phase which generates, at said output port of said analog-to-digital conversion means, a digital representation of said analog input signal, which digital representation may contain unwanted noise;

time-delay means;

DC blocking filtering means including an input port and an output port, said DC blocking filtering means exhibiting an open-loop transmission response substantially equal to that of said main loop gain and phase, except for (a) a null at that one of said resonance frequencies of said comb which lies immediately above said Nyquist frequency and (b) a null at zero frequency;

regenerative loop coupling means coupled to said delay means, to said third port of said first coupling means, to said input and output ports of said DC blocking filtering means, and to said third input port of said summing means, for thereby forming a regenerative feedback loop including said delay, said DC blocking filtering means, at least a portion of said summing means, and that portion of said first coupling means lying between said input and third ports of said first coupling means, the open-loop response of said regenerative loop coupling means, when combined with the delay of said delay means, said DC blocking filtering means, and said portion of said first coupling means lying between said input and third ports of said first coupling means, being selected to have nominally unity gain and zero degrees of phase shift at said selected resonance frequency, whereby the delay of said regenerative loop establishes said selected resonance frequency, the open-loop gain of said main loop, with said regenerative loop in said main loop, is maximized at said selected resonance frequency, and the noise of said analog-to-digital conversion means is attenuated at said selected resonance frequency when both said main and regenerative loops are closed.

2. A converter according to claim 1, further comprising delay means coupled in one of said main and regenerative feedback loops for tending to make the loop delay of said main loop equal to the loop delay of said regenerative loop.

3. A converter according to claim 1, wherein said regenerative loop comprises a phase shifter.

4. A converter according to claim 1, wherein said time-delay means comprises a discrete delay element.

5. A converter according to claim 1, wherein said regenerative loop coupling means comprises a gain control element.

6. A converter according to claim 5, wherein said gain control element comprises amplifying means.

7. A converter according to claim 1, wherein said first coupling means includes phase correction means coupled between said input port and said third port.

8. A converter according to claim 1, further including main loop delay means coupled in said main degenerative feedback loop, for matching the delay around said main degenerative feedback loop with the delay around said regenerative feedback loop.

9. A converter according to claim 1 wherein:

said regenerative loop coupling means comprises first phase control means, for controlling the frequency of the lowest one of said resonant frequencies from said count of periodic resonance frequencies; and said main loop further comprises second phase control means having an input port coupled to said third port, for phase shifting signals traversing said first coupling means, and for controlling the phase around said main degenerative feedback.

10. A converter according to claim 9, wherein:

said first coupling means further includes second summing means including a first input port coupled to said second phase control means for receiving phase-shifted signals therefrom, and also including a second input port, for summing said phase-shifted signals from said second phase control means with signals applied to said second input port of said second summing means, for generating summed signals, and for propagating said summed signals toward said input of said analog-to-digital conversion means;

said regenerative loop coupling means further comprises delay means cascaded with third phase control means to form a cascade, said cascade being coupled in parallel with said first phase control means; and fourth phase control means coupled to said second input port of said second summing means and to a junction of said cascade, and said first phase control means.

11. A sigma-delta analog-to-digital converter, comprising:

first DC blocking filtering means including an input port and an output port, for exhibiting a particular open-loop transmission response, with the addition of (a) a null at zero frequency, and (b) a null at a particular frequency;

regenerative loop phase control means;

first summing means including first and second input ports, and an output port;

regenerative loop coupling means coupled to said first DC blocking filtering means, to said regenerative loop phase control means, and to said second input port of said first summing means, for closing a regenerative loop having an open-loop response between said first input port of said first summing means and an output point on said regenerative loop exhibiting a null at zero frequency, and a comb of periodic resonance frequencies, including at least one of which resonance frequencies is suppressed by said null at said particular frequency;

sampled analog-to-digital conversion means including an input port coupled to said output point of said regenerative loop, being sampled at a sampling frequency, and for converting analog signals applied to said input port into digital format a system output port, which aliasing occurs for analog input signals exceeding a Nyquist frequency equal to half said sample frequency;

equalized sampled digital-to-analog conversion means including an input prot coupled to said sampled analog-to-digital conversion means, for reconverting said digital signals from said analog-to-digital conversion means into analog form, said equalized sampled digital-to-analog conversion means having said particular open-loop transmission response;

DC blocking degenerative loop coupling means coupled to said sampled digital-to-analog conversion means and to said first input port of said first summing means, for closing a degenerative feedback loop, for receiving band-limited analog signals, subtracting degenerative feedback loss signals therefrom, to form difference signals, and for applying said difference signals to said regenerative loop, for thereby converting said band-limited analog signals into digital signals at said system output port, with noise suppression at one of said periodic resonance frequencies, which is under the control of said resonance loop phase control means.

* * * * *